United States Patent
Hong et al.

(10) Patent No.: US 12,067,292 B2
(45) Date of Patent: Aug. 20, 2024

(54) METHOD OF IDENTIFYING INFORMATION RELATED TO AN EYE OPEN MONITOR (EOM) OPERATION PERFORMED IN A MEMORY DEVICE, AND MEMORY SYSTEM PERFORMING THE METHOD

(71) Applicant: SAMSUNG ELECTRONICS CO., LTD., Suwon-si (KR)

(72) Inventors: Sung Tack Hong, Seongnam-si (KR); Chang Min Jeon, Suwon-si (KR); YeJin Cho, Hwaseong-si (KR); Young San Kang, Yongin-si (KR); Won Ho Kang, Seoul (KR); Kwang Won Park, Suwon-si (KR); HyunSoo Shim, Uijeongbu-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 23 days.

(21) Appl. No.: 17/741,977

(22) Filed: May 11, 2022

(65) Prior Publication Data
US 2022/0391141 A1    Dec. 8, 2022

(30) Foreign Application Priority Data

Jun. 4, 2021    (KR) .................. 10-2021-0072614

(51) Int. Cl.
*G06F 3/06* (2006.01)
(52) U.S. Cl.
CPC .......... *G06F 3/0659* (2013.01); *G06F 3/0604* (2013.01); *G06F 3/0656* (2013.01); *G06F 3/0679* (2013.01)

(58) Field of Classification Search
CPC .... G06F 3/0659; G06F 3/0604; G06F 3/0656; G06F 3/0679; G06F 13/1689; G06F 3/0653; G06F 11/3037; G06F 13/1673; G11C 29/023; G11C 2029/0409; G11C 29/028; G11C 16/0483; G11C 16/24
See application file for complete search history.

(56) References Cited

U.S. PATENT DOCUMENTS

| | | | |
|---|---|---|---|
| 4,475,210 A | 10/1984 | Couch | |
| 7,782,934 B2 | 8/2010 | Choi | |
| 7,787,536 B2 | 8/2010 | Chou | |
| 9,356,772 B2 | 5/2016 | Lee et al. | |
| 9,665,289 B1 | 5/2017 | Mach et al. | |
| 9,990,973 B1* | 6/2018 | Jeter | G06F 13/1689 |
| 10,014,907 B2 | 7/2018 | Choi et al. | |
| 2010/0097087 A1 | 4/2010 | Hogeboom et al. | |

(Continued)

OTHER PUBLICATIONS

European Search Report dated Aug. 19, 2022 in corresponding European Application No. EP 22 154 775.5.

(Continued)

*Primary Examiner* — Tasnima Matin
(74) *Attorney, Agent, or Firm* — F. Chau & Associates, LLC

(57) ABSTRACT

A method of operating a host device includes transmitting a read command that requests information related to an eye open monitor (EOM) operation performed in a memory device to the memory device, and receiving a response signal including the information related to the EOM operation performed in the memory device from the memory device.

20 Claims, 22 Drawing Sheets

(56) References Cited

U.S. PATENT DOCUMENTS

2014/0293718 A1* 10/2014 Prakash .................. G11C 7/00
                                                    365/193
2016/0209462 A1    7/2016 Choi et al.
2019/0391761 A1* 12/2019 Brief ..................... G06F 3/0656

OTHER PUBLICATIONS

Yu-Chuan Lin et al., "A 10-Gb/s Eye-Opening Monitor Circuit for Receiver Equalizer Adaptations in 65-nm CMOS", IEEE Transactions on Very Large Scale Intergration (VLSI) Systems, vol. 28, No. 1, Jan. 2020.

* cited by examiner

FIG. 9

| Byte \ Bit | 7 | 6 | 5 | 4 | 3 | 2 | 1 | 0 |
|---|---|---|---|---|---|---|---|---|
| 0 | Operation code (3Bh) ||||||||
| 1 | Reserved |||| Mode = 1Fh ||||
| 2 | BUFFER ID ||||||||
| 3 | (MSB) |||||||  |
| 4 | BUFFER OFFSET ||||||||
| 5 |  ||||||| (LSB) |
| 6 | (MSB) |||||||  |
| 7 | PARAMETER LIST LENGTH ||||||||
| 8 |  ||||||| (LSB) |
| 9 | Control = 00h ||||||||

FIG. 10

| MODE | DESCRIPTION |
|---|---|
| 00h | Not used in UFS |
| 01h | Vendor Specific |
| 02h | Data |
| ... | Not used in UFS |
| 0Eh | Download microcode with offsets, save and defer active |
| ... | Not used in UFS |
| 1Dh | Reserved |
| 1Eh | Reserved |
| 1Fh | EYE OPEN MONITOR |

FIG. 11

| Byte \ Bit | 7 | 6 | 5 | 4 | 3 | 2 | 1 | 0 | |
|---|---|---|---|---|---|---|---|---|---|
| 0 | (MSB) | | | | | | | | |
| 1 | | | EOM DATA LENGTH (N-11) | | | | | | EDH |
| 2 | | | | | | | | (LSB) | |
| 3 | PHASE SELECT | | | | | | | | |
| 4 | VREF CONTROL | | | | | | | | |
| 5 | NUMBER OF SAMPLING | | | | | | | | |
| 6 | VREF RESOLUTION | | | | PHASE RESOLUTION (GEAR) | | | | |
| 7 | Reserved = 00h | | | | | | | | |
| 8 | Reserved = 00h | | | | | | | | |
| 9 | Reserved = 00h | | | | | | | | |
| 10 | Reserved = 00h | | | | | | | | |
| 11 | Reserved = 00h | | | | | | | | |

| 12 | Data[0] | |
|---|---|---|
| ... | ... | EDP |
| N | Data[EOM DATA LENGTH - 1] | |

FIG. 13

| Byte \ Bit | 7 | 6 | 5 | 4 | 3 | 2 | 1 | 0 | |
|---|---|---|---|---|---|---|---|---|---|
| 0 | (MSB) | | | | | | | | |
| 1 | | | Total Data Length (N+1) | | | | | | |
| 2 | | | | | | | | (LSB) | |
| 3 | (MSB) | | | | | | | | |
| 4 | | | EOM Data Pattern Length (N-11) | | | | | | |
| 5 | | | | | | | | (LSB) | EDH |
| 6 | Timing Step | | | | | | | | |
| 7 | Voltage Step | | | | | | | | |
| 8 | Number of Sampling | | | | | | | | |
| 9 | Timing Offset | | | | | | | | |
| 10 | Voltage Offset | | | | | | | | |
| 11 | Reserved 1 | | | | | | | | |
| 12 | | | | | | | | | |
| 13 | | | | | | | | | |
| 14 | | | | | | | | | |
| 15 | | | | | | | | | |
| 16 | | | | | | | | | |
| 17 | | | | | | | | | |
| 18 | | | | | | | | | |
| 19 | | | EOM Data Pattern | | | | | | EDP |
| 20 | | | | | | | | | |
| 21 | | | | | | | | | |
| 8 | | | | | | | | | |
| N-2 | | | | | | | | | |
| ... | | | | | | | | | |
| N | | | | | | | | | |

FIG. 14

| | 0 | 1 | 2 | 3 |
|---|---|---|---|---|
| | \multicolumn{4}{c|}{Response UPIU} | | | |

| Byte | 0 | 1 | 2 | 3 |
|---|---|---|---|---|
| 0 | xx10 0001b | Flags | LUN | Task Tag |
| 4 | IID \| Command Set Type | Reserved | Response | Status |
| 8 | Total EHS Length (00h) | Device Information | Data Segment Length | |
| 12 | (MSB) | Residual Transfer Count | | (LSB) |
| 16 | | Reserved | | |
| 20 | | Reserved | | |
| 24 | | Reserved | | |
| 28 | | Reserved | | |
| | Header E2ECRC (omit if HD=0) | | | |
| k | Sense Data Length | | Sense Data[0] | Sense Data[1] |
| k+4 | Sense Data[2] | Sense Data[3] | Sense Data[4] | Sense Data[5] |
| | ... | ... | ... | ... |
| k+16 | Sense Data[14] | Sense Data[15] | Sense Data[16] | Sense Data[17] |
| | Data E2ECRC (omit if DD=0) | | | |

NOTE 1 k = 32 if HD = 0.

FIG. 18

| Bit<br>Byte | 7 | 6 | 5 | 4 | 3 | 2 | 1 | 0 |
|---|---|---|---|---|---|---|---|---|
| 0 | Operation code (3Ch) ||||||||
| 1 | Reserved |||| Mode = 1Fh ||||
| 2 | BUFFER ID ||||||||
| 3 | (MSB) | | | | | | | |
| 4 | BUFFER OFFSET ||||||||
| 5 | | | | | | | | (LSB) |
| 6 | (MSB) | | | | | | | |
| 7 | ALLOCATION LENGTH ||||||||
| 8 | | | | | | | | (LSB) |
| 9 | Control = 00h ||||||||

FIG. 19

| BUFFER ID | DESCRIPTION |
|---|---|
| 00h | Specific Coordinate axes (error count for specific offset value) |
| 01h | EOM Parameter (EOM offset) Only |
| 02h | Channel Parameter (TX/RX Parameter) Only |
| 03h | EOM Parameter & Channel Parameter |

FIG. 20

| Bit<br>Byte | 7 | 6 | 5 | 4 | 3 | 2 | 1 | 0 |
|---|---|---|---|---|---|---|---|---|
| 0 | Operation code (3Ch) ||||||||
| 1 | Reserved ||| Mode = 1Fh |||||
| 2 | BUFFER ID ||||||||
| 3 | (MSB) X-axis |||||||| 
| 4 | (LSB) \| (MSB) Y-axis ||||||||
| 5 | (LSB) ||||||||
| 6 | (MSB) ||||||||
| 7 | ALLOCATION LENGTH ||||||||
| 8 | (LSB) ||||||||
| 9 | Control = 00h ||||||||

FIG. 21

| Bit<br>Byte | 7 | 6 | 5 | 4 | 3 | 2 | 1 | 0 |
|---|---|---|---|---|---|---|---|---|
| 0 | (MSB) | | | | | | | |
| 1 | | | | ERR_CNT.(Value) | | | | |
| 2 | | | | | | | | |
| 3 | | | | | | | | (LSB) |
| 4 | | | | | | | | |
| 5 | | | | | | | | |
| 6 | | | | | | | | |
| 7 | | | | | | | | |
| 8 | | | | | | | | |
| 9 | | | | | | | | |
| 10 | | | | | | | | |
| 11 | | | | | | | | |

| 12 | |
|---|---|
| ... | |
| N | |

FIG. 22

| Bit<br>Byte | 7 | 6 | 5 | 4 | 3 | 2 | 1 | 0 |
|---|---|---|---|---|---|---|---|---|
| 0 | colspan="8" | PHASE SELECT |||||||
| 1 | VREF CONTROL |||||||| 
| 2 | NUMBER OF SAMPLING |||||||| 
| 3 | (MSB) | | | | | | | |
| 4 | ERR_CNT.(Value) |||||||| 
| 5 | | | | | | | | |
| 6 | | | | | | | | (LSB) |
| 7 | Reserved = 00h |||||||| 
| 8 | Reserved = 00h |||||||| 
| 9 | Reserved = 00h |||||||| 
| 10 | Reserved = 00h |||||||| 
| 11 | Reserved = 00h ||||||||

| 12 | Data[0] |
|---|---|
| ... | |
| N | Data[EOM DATA LENGTH - 1] |

FIG. 23

| Bit<br>Byte | 7 | 6 | 5 | 4 | 3 | 2 | 1 | 0 |
|---|---|---|---|---|---|---|---|---|
| 0 | (MSB) | | | | | | | |
| 1 | | | | | | | | |
| 2 | | | Parameter Value #1 (Value) | | | | | |
| 3 | | | | | | | | (LSB) |
| 4 | (MSB) | | | | | | | |
| 5 | | | | | | | | |
| 6 | | | Parameter Value #2 (Value) | | | | | |
| 7 | | | | | | | | (LSB) |
| ... | | | | | | | | |
| 4N-1 | (MSB) | | | | | | | |
| 4N | | | | | | | | |
| 4N+1 | | | Parameter Value #N (Value) | | | | | |
| 4N+2 | | | | | | | | (LSB) |
| 4N+3 | (MSB) | | | | | | | |
| ... | | | ERR_CNT.(Value) | | | | | |
| | | | | | | | | |
| | | | | | | | | (LSB) |
| | | | Reserved = 00h | | | | | |
| | | | Reserved = 00h | | | | | |
| | | | Reserved = 00h | | | | | |
| | | | Reserved = 00h | | | | | |

| 12 | Data[0] |
|---|---|
| ... | |
| N | Data[EOM DATA LENGTH - 1] |

FIG. 25

| Bit<br>Byte | 7 | 6 | 5 | 4 | 3 | 2 | 1 | 0 |
|---|---|---|---|---|---|---|---|---|
| 0 | | | | | | | | |
| 1 | | | | | | | | |
| 2 | | | | | | | | |
| 3 | (MSB) | | | | | | | |
| 4 | | Parameter Value #1 (Value) | | | | | | |
| 5 | | | | | | | | |
| 6 | | | | | | | | (LSB) |
| 7 | (MSB) | | | | | | | |
| 8 | | Parameter Value #2 (Value) | | | | | | |
| 9 | | | | | | | | |
| 10 | | | | | | | | (LSB) |
| ... | | | | | | | | |
| 4N-1 | (MSB) | | | | | | | |
| 4N | | Parameter Value #N (Value) | | | | | | |
| 4N+1 | | | | | | | | |
| 4N+2 | | | | | | | | (LSB) |
| 4N+3 | (MSB) | | | | | | | |
| ... | | ERR_CNT.(Value) | | | | | | |
| | | | | | | | | |
| | | | | | | | | (LSB) |

METHOD OF IDENTIFYING INFORMATION RELATED TO AN EYE OPEN MONITOR (EOM) OPERATION PERFORMED IN A MEMORY DEVICE, AND MEMORY SYSTEM PERFORMING THE METHOD

CROSS-REFERENCE TO RELATED APPLICATION

This application claims priority under 35 U.S.C. § 119 to Korean Patent Application No. 10-2021-0072614 filed on Jun. 4, 2021, the disclosure of which is incorporated by reference herein in its entirety.

TECHNICAL FIELD

Embodiments of the present disclosure relate to a method of operating a host device and a memory device, and a memory system including the host device and the memory device.

DISCUSSION OF RELATED ART

An eye opening monitor (EOM) is used to determine quality characteristics of signals transmitted and received on a channel. For example, a signal transmission/reception quality between a memory device and a host device may be improved by measuring an eye of a signal received at a signal receive end (e.g., a receiver of a memory device) in a memory system.

SUMMARY

Aspects of the present disclosure provide a method of operating a host device capable of efficiently and reliably performing an eye open monitor (EOM).

Aspects of the present disclosure also provide a method of operating a memory device capable of efficiently and reliably performing an EOM.

Aspects of the present disclosure also provide a memory system capable of efficiently and reliably performing an EOM.

According to some aspects of the present disclosure, there is provided a method of operating a host device including transmitting a read command that requests information related to an eye open monitor (EOM) operation performed in a memory device to the memory device, and receiving a response signal including the information related to the EOM operation performed in the memory device from the memory device.

According to some aspects of the present disclosure, there is provided a method of operating a memory device including receiving a read command that requests information related to an EOM operation performed in the memory device from a host device, identifying an indication field of the read command, and transmitting a response signal including information corresponding to a value of the indication field among the information related to the EOM operation to the host device.

According to some aspects of the present disclosure, there is provided a memory system including a host device including a host controller, and a memory device including a device controller. The host controller transmits a read command that requests information related to an EOM operation performed in the memory device to the memory device, the read command includes an indication field indicating information to be included in a response signal among the information related to the EOM operation performed in the memory device, and the device controller transmits the response signal including information corresponding to a value of the indication field among the information related to the EOM operation to the host device in response to the read command.

BRIEF DESCRIPTION OF THE DRAWINGS

The above and other aspects and features of the present disclosure will become more apparent by describing in detail embodiments thereof with reference to the accompanying drawings, in which:

FIGS. 9 to 14 are diagrams for describing an operation of a memory system according to some embodiments;

FIGS. 18 to 25 are diagrams for describing an operation of a memory system according to some other embodiments;

DETAILED DESCRIPTION OF THE EMBODIMENTS

Figure 1:
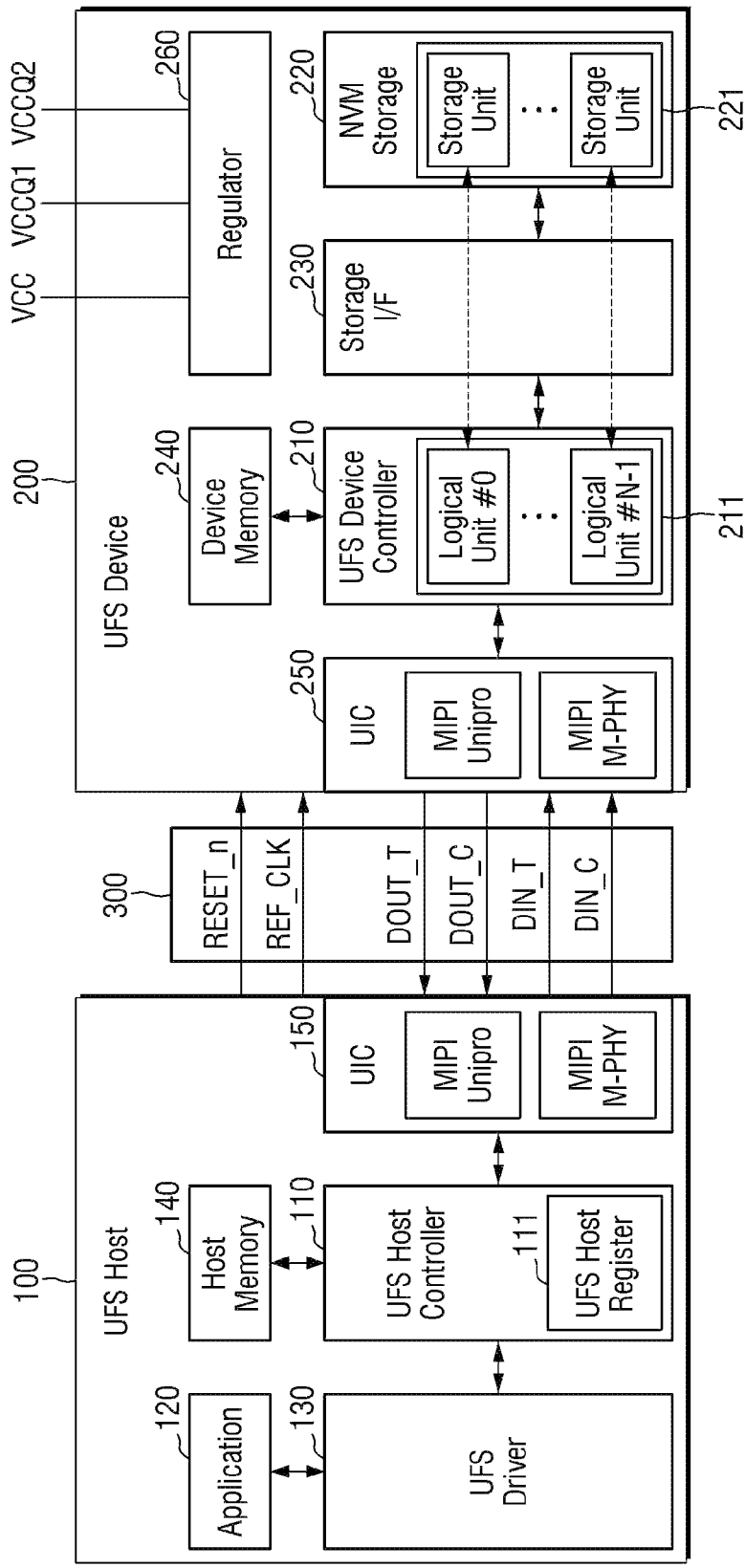
FIG. 1 is a diagram illustrating a memory system according to some embodiments.

Embodiments of the present disclosure will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

Herein, when one value is described as being about equal to another value or being substantially the same as or equal to another value, it is to be understood that the values are identical, the values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art.

Figure 2:
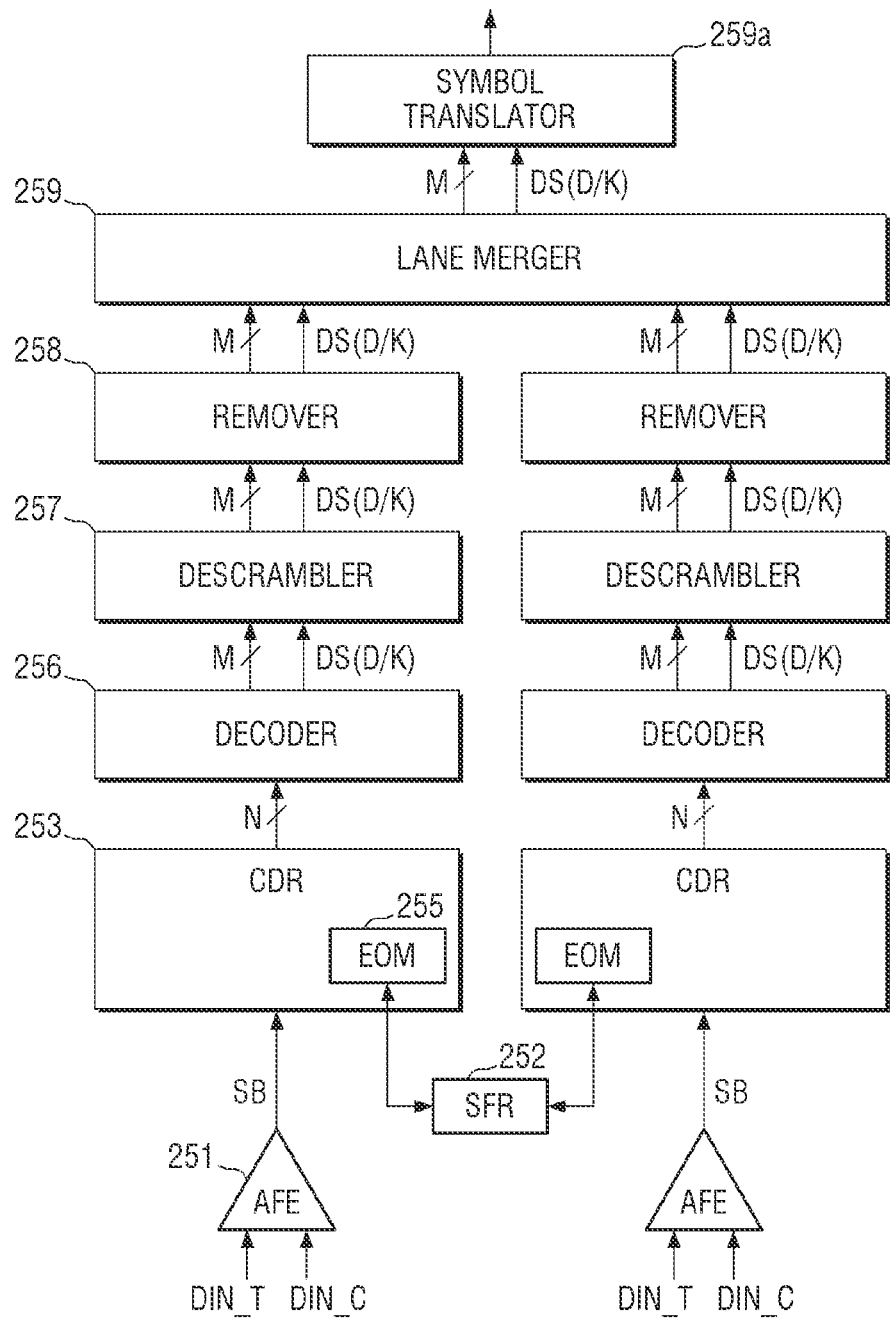
FIG. 2 is a diagram illustrating a universal flash storage (UFS) interconnect (UIC) layer of FIG. 1 according to some embodiments.
Figure 3:
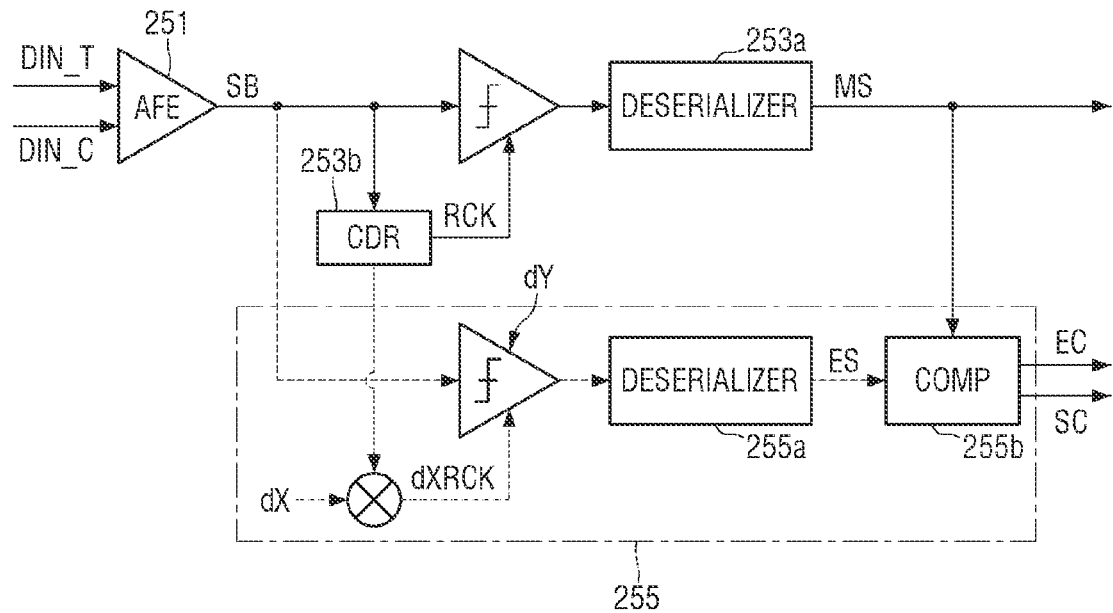
FIG. 3 is a diagram illustrating a clock data recovery (CDR) block of FIG. 2 according to some embodiments.
Figure 4:
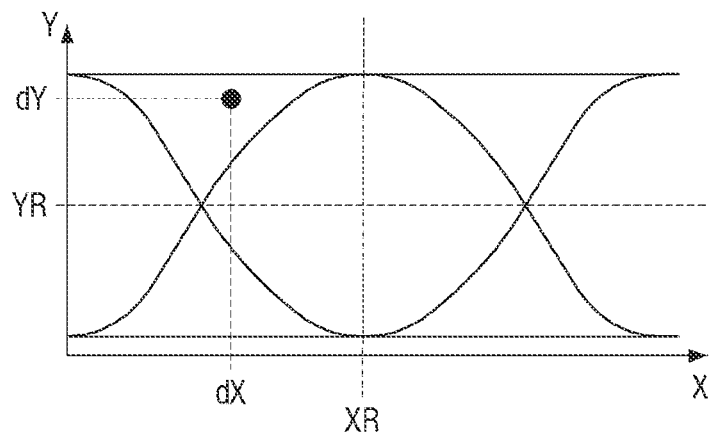
FIG. 4 is a diagram for describing an eye open monitor (EOM) operation according to some embodiments.

FIG. 1 is a diagram illustrating a memory system according to some embodiments. FIG. 2 is a diagram illustrating a universal flash storage (UFS) interconnect (UIC) layer of FIG. 1 according to some embodiments. FIG. 3 is a diagram illustrating a clock data recovery (CDR) block of FIG. 2 according to some embodiments. FIG. 4 is a diagram for describing an eye open monitor (EOM) operation according to some embodiments.

Hereinafter, a memory system according to embodiments of the present disclosure will be described with reference to a system conforming to a universal flash storage (UFS) standard implemented by Joint Electron Device Engineering Council (JEDEC) as an example. However, embodiments of the present disclosure are not limited thereto, and aspects of a memory system according to embodiments of the present disclosure may be variously modified.

Referring to FIG. 1, a memory system 1 may include a host device 100, a memory device 200, and a UFS interface 300.

The host device 100 and the memory device 200 may be interconnected through the UFS interface 300. In some embodiments, the host device 100 may be implemented as a portion of an application processor.

The host device 100 may include a UFS host controller 110, an application 120, a UFS driver 130, a host memory 140, and a UFS interconnect (UIC) layer 150.

The memory device 200 may include a UFS device controller 210, a nonvolatile memory storage 220, a storage interface 230, a device memory 240, a UIC layer 250, and a regulator 260.

The nonvolatile memory storage 220 may include a plurality of storage units 221. Such a storage unit 221 may include a V-NAND flash memory having a two-dimensional (2D) structure or a three-dimensional (3D) structure, but may also include other types of nonvolatile memories such as, for example, a phase-change random access memory (PRAM) and/or a resistive random access memory (RRAM).

The UFS device controller 210 and the nonvolatile memory storage 220 may be interconnected through the storage interface 230. The storage interface 230 may be implemented to comply with a standard convention such as, for example, toggle or open NAND flash interface (ONFI). An operation between the UFS device controller 210 and the nonvolatile memory storage 220 using the toggle will be described further below.

The application 120 may refer to a program that communicates with the memory device 200 to use a function of the memory device 200. The application 120 may transmit an input-output request (IOR) to the UFS driver 130 for input/output to/from the memory device 200. The input-output request (IOR) may refer to, for example, a read request, a write request, and/or an erase request of data, but is not limited thereto.

The UFS driver 130 may manage the UFS host controller 110 through a UFS-host controller interface (HCI). The UFS driver 130 may convert the input-output request generated by the application 120 into a UFS command defined by the UFS standard, and transfer the converted UFS command to the UFS host controller 110. One input-output request may be converted into multiple UFS commands. The UFS command may be a command defined by a small computer system interface (SCSI) standard, but is not limited thereto. For example, in some embodiments, the UFS command may be a command dedicated to the UFS standard.

The UFS host controller 110 may transmit the UFS command converted by the UFS driver 130 to the UIC layer 250 of the memory device 200 through the UIC layer 150 and the UFS interface 300. In this process, a UFS host register 111 of the UFS host controller 110 may serve as a command queue (CQ).

The UIC layer 150 of the host device 100 may include MIPI M-PHY and MIPI UniPro, and the UIC layer 250 of the memory device 200 may also include MIPI M-PHY and MIPI UniPro.

The UFS interface 300 may include a line transmitting a reference clock REF_CLK, a line transmitting a hardware reset signal RESET_n for the memory device 200, a pair of lines transmitting a pair of differential input signals DIN_T and DIN_C, and a pair of lines transmitting a pair of differential output signals DOUT_T and DOUT_C.

A frequency value of the reference clock provided from the host device 100 to the memory device 200 may be, for example, about 19.2 MHz, about 26 MHz, about 38.4 MHz, or about 52 MHz, but is not necessarily limited thereto. The host device 100 may change the frequency value of the reference clock during operation, that is, during a period in which data transmission/reception is performed between the host device 100 and the memory device 200.

The memory device 200 may generate clocks of various frequencies from the reference clock provided from the host device 100 using, for example, a phase-locked loop (PLL). In addition, the host device 100 may set a value of a data rate between the host device 100 and the memory device 200 through the frequency value of the reference clock. That is, the value of the data rate may be determined depending on the frequency value of the reference clock.

The UFS interface 300 may support multiple lanes, and each lane may be implemented as a differential pair. For example, the UFS interface 300 may include one or more receive lanes and one or more transmit lanes. In FIG. 1, the pair of lines transmitting the pair of differential input signals DIN_T and DIN_C may constitute the receive lane, and the pair of lines transmitting the pair of differential output signals DOUT_T and DOUT_C may constitute the transmit lane. Although one pair of transmit lanes and one pair of receive lanes are illustrated in FIG. 1, the number of transmit lanes and receive lanes is not limited thereto, and may be modified.

The receive lane and the transmit lane may transmit data in a serial communication manner, and the host device 100 and the memory device 200 may communicate with each other in a full-duplex manner by a structure in which the receive lane and the transmit lane are separated from each other. That is, the memory device 200 may transmit data to the host device 100 through the transmit lane while receiving data from the host device 100 through the receive lane. In addition, control data such as a command from the host device 100 to the memory device 200 and user data that the host device 100 intends to store in or read from the nonvolatile memory storage 220 of the memory device 200 may be transmitted through the same lane. Accordingly, in some embodiments, a separate lane for data transmission between the host device 100 and the memory device 200 is not utilized in addition to a pair of receive lanes and a pair of transmit lanes.

Referring to FIG. 2, the UIC layer 250 may include equalizers 251 each including an analog front end (AFE), clock data recovery (CDR) blocks 253, decoders 256, descramblers 257, symbol removers 258, a lane merger 259, and a symbol translator 259a.

The equalizer 251 may receive the pair of differential input signals DIN_T and DIN_C from the host device 100 (see FIG. 1), perform equalization, and output a serial bit SB. In some embodiments, the host device 100 (see FIG. 1) may provides the pair of differential input signals DIN_T and DIN_C, which are serial signals, to the equalizer 251, and the equalizer 251 may output the serial bit SB from the pair of differential input signals DIN_T and DIN_C.

The CDR block 253 may perform clock data recovery (CDR) and data deserialization, and output an N-bit signal, where N is a natural number. The CDR block 253 may include an eye opening monitor (EOM) block 255 performing an EOM operation to measure a signal quality of a communication channel with the host device 100 (see FIG. 1).

In some embodiments, the EOM operation performed in the CDR block 253 may be performed using, for example, a special function register (SFR) 252, but embodiments are not limited thereto.

Referring to FIGS. 2 and 3, the EOM operation performed in the CDR block 253 may be performed by measuring a quality of a signal received from the host device 100 under a specific offset condition using the SFR 252.

For example, the EOM operation may be performed by comparing a main path signal MS of a main path indicated by a solid line in FIG. 3 with an EOM path signal ES of an EOM path indicated by a dotted line in FIG. 3.

The main path may recover a clock from the serial bit SB received from the host device 100 and passing through the equalizer 251 using a clock recovery circuit 253b, extract data of the serial bit SB using the recovered clock RCK, and then generate the main path signal MS through a deserializer 253a. The main path signal MS generated as such may be transferred to a comparator 255b.

The EOM path may generate a clock dxRCK by reflecting a specific offset value dX in the clock recovered from the serial bit SB received from the host device 100 and passing through the equalizer 251, extract data of the serial bit SB by reflecting the clock dxRCK and a specific offset value dY, and then generate the EOM path signal ES through a deserializer 255a. The EOM path signal MS generated as such may be transferred to the comparator 255b.

For example, the main path signal MS may be data extracted under reference conditions XR and YR of FIG. 4, and the EOM path signal ES may be data extracted under offset conditions dX and dY of FIG. 4.

The comparator 255b does not output an error count signal EC when the EOM path signal ES is recognized as the same signal as the main path signal MS, and may output the error count signal EC when the EOM path signal ES is not recognized as the same signal as the main path signal MS. That is, error counting may be performed by the error count signal EC output from the comparator 255b.

In addition, the comparator 255b may output a sampling count signal SC whenever such sampling (e.g., comparison between the EOM path signal ES and the main path signal MS) is performed once.

In some embodiments, the offset value dX may include, for example, a time offset value, a phase offset value, etc., and the offset value dY may include, for example, a voltage offset value, but embodiments are not limited thereto.

In some embodiments, the offset dX, the offset dY, an error count value according to the error count signal EC, information on the number of sampling operations according to the sampling count signal SC, etc., may be stored in the SFR 252, but embodiments are not limited thereto.

Referring back to FIG. 2, the decoder 256 may decode the N-bit signal output from the CDR block 253 into an M-bit signal, where M is a natural number smaller than N, and a discrimination signal DS. In some embodiments, the N-bit signal may be a 10-bit signal, and the M-bit signal may be an 8-bit signal, but embodiments are not limited thereto.

The decoder 256 may output a data signal D as the discrimination signal DS when the input N-bit signal is a data symbol, and output a control signal K as the discrimination signal DS when the input N-bit signal is a control symbol.

The descrambler 257 may descramble and output the input M-bit signal. The symbol remover 258 may remove skip symbols such as, for example, a marker and a filler symbol from the input M-bit signal. The lane merger 259 may merge signals input to each lane and provide the merged signal to the symbol translator 259a. The symbol translator 259a may translate and output the symbol.

Referring back to FIG. 1, the UFS device controller 210 of the memory device 200 may generally control an operation of the memory device 200.

The UFS device controller 210 may manage the nonvolatile memory storage 220 through logical units (LUs) 211 which are logical data storage units. The number of LUs 211 may be, for example, eight, but embodiments are not limited thereto.

The UFS device controller 210 may include a flash translation layer (FTL), and may convert a logical data address, for example, a logical block address (LBA), transferred from the host device 100, to a physical data address, for example, a physical data address or a physical page number using address mapping information of the FTL. In the memory system 1, a logical block for storing user data may have a size in a predetermined range. For example, a minimum size of the logical block may be set to 4 Kbytes.

When a command from the host device 100 is input to the memory device 200 through the UIC layer 250, the UFS device controller 210 may perform an operation according to the input command, and may transmit a completion response to the host device 100 when the operation is completed.

As an example, when the host device 100 intends to store user data in the memory device 200, the host device 100 may transmit a data write command to the memory device 200. When a response indicating that the memory device 200 has been ready-to-receive the user data is received from the memory device 200, the host device 100 may transmit the user data to the memory device 200. The UFS device controller 210 may temporarily store the received user data in the device memory 240, and may store the user data temporarily stored in the device memory 240 in a selected position of the nonvolatile memory storage 220 based on the address mapping information of the FTL.

As another example, when the host device 100 intends to read user data stored in the memory device 200, the host device 100 may transmit a data read command to the memory device 200. The UFS device controller 210 receiving the data read command may read the user data from the nonvolatile memory storage 220 based on the data read command and temporarily store the read user data in the device memory 240. In such a read process, the UFS device controller 210 may detect and correct an error in the read user data using a built-in error correction code (ECC) circuit. In addition, the UFS device controller 210 may transmit the user data temporarily stored in the device memory 240 to the host device 100.

In addition, the UFS device controller 210 may further include an advanced encryption standard (AES) circuit. The AES circuit may encrypt or decrypt data input to the UFS device controller 210 using a symmetric-key algorithm.

The host device 100 may sequentially store commands to be transmitted to the memory device 200 in the UFS host register 111 that may function as the command queue, and sequentially transmit the commands to the memory device 200. In this case, even when the previously transmitted command is still being processed by the memory device 200, that is, even before a notification indicating that processing of the previously transmitted command by the memory device 200 has been completed is received, the host device 100 may transmit the next command queued in the command queue to the memory device 200. Accordingly, the memory device 200 may receive the next command from the host device 100 while processing the previously transmitted command. The maximum number of commands (queue depth) that may be stored in such a command queue may be, for example, 32. In addition, the command queue may be implemented as a circular queue type that indicates a start and an end of a command string stored in the queue through a head pointer and a tail pointer, respectively.

Each of the plurality of storage units 221 may include a memory cell array and a control circuit that controls an operation of the memory cell array. The memory cell array may include a two-dimensional memory cell array or a three-dimensional memory cell array. The memory cell array may include a plurality of memory cells, each of which may be a single level cell (SLC) storing information of one bit, but is not limited thereto, and may be a cell storing information of two or more bits, such as, for example, a multi level cell (MLC), a triple level cell (TLC), or a quadruple level cell (QLC). The three-dimensional memory cell array may include a vertical NAND string vertically oriented so that at least one memory cell is positioned on another memory cell. This will be described in further detail below.

VCC, VCCQ1, and VCCQ2 may be input to the memory device 200 as power supply voltages. VCC is a main power supply voltage for the memory device 200 and may have a value of, for example, about 2.4 V to about 3.6 V. VCCQ1 is a power supply voltage for supplying a voltage in a low range, is primarily used for the UFS device controller 210, and may have a value of, for example, about 1.14 V to about 1.26 V. VCCQ2 is a power supply voltage for supplying a voltage lower than VCC but higher than VCCQ1, is primarily used for an input/output interface such as MIPI M-PHY 250, and may have a value of, for example, about 1.7 V to about 1.95 V. The power supply voltages may be supplied to respective components of the memory device 200 through the regulator 260. The regulator 260 may be implemented as a set of unit regulators each connected to different ones of the above-described power supply voltages.

Figure 5:
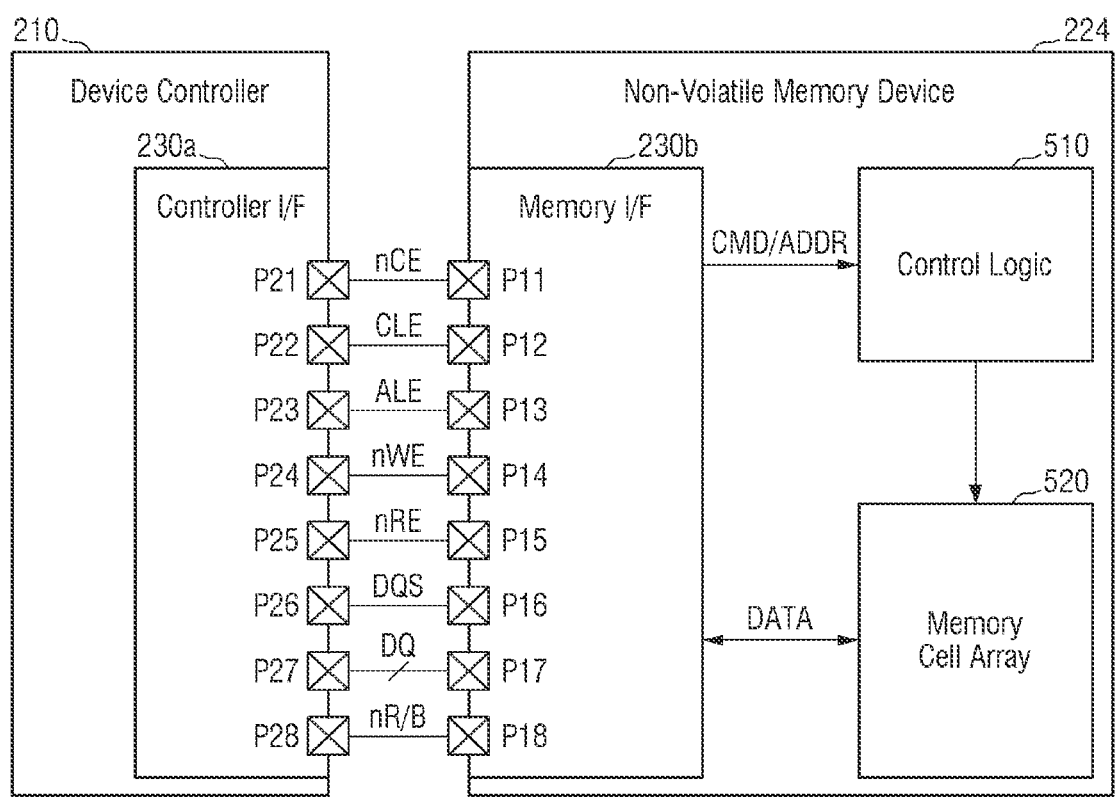
FIG. 5 is a diagram illustrating reconfiguration of a UFS device controller, a storage interface, and a nonvolatile memory storage of FIG. 1 according to some embodiments.

FIG. 5 is a diagram illustrating reconfiguration of a UFS device controller, a storage interface, and a nonvolatile memory storage of FIG. 1 according to some embodiments.

The storage interface 230 of FIG. 1 may include a controller interface circuit 230a and a memory interface circuit 230b of FIG. 5. In some embodiments, a storage device 224 illustrated in FIG. 5 may correspond to one storage unit 221 of FIG. 1. In addition, in some embodiments, the storage device 224 may correspond to the nonvolatile memory storage 220 of FIG. 1.

The storage device 224 may include first to eighth pins P11 to P18, the memory interface circuit 230b, a control logic circuit 510, and a memory cell array 520.

The memory interface circuit 230b may receive a chip enable signal nCE from the device controller 210 through the first pin P11. The memory interface circuit 230b may transmit and receive signals to and from the device controller 210 through the second to eighth pins P12 to P18 according to the chip enable signal nCE. For example, when the chip enable signal nCE is in an enable state (e.g., at a low level), the memory interface circuit 230b may transmit and receive signals to and from the device controller 210 through the second to eighth pins P12 to P18.

The memory interface circuit 230b may receive a command latch enable signal CLE, an address latch enable signal ALE, and a write enable signal nWE from the device controller 210 through the second to fourth pins P12 to P14. The memory interface circuit 230b may receive a data signal DQ from the device controller 210 or transmit a data signal DQ to the device controller 210 through the seventh pin P17. A command CMD, an address ADDR, and data DATA may be transferred through the data signal DQ. For example, the data signal DQ may be transferred through a plurality of data signal lines. In this case, the seventh pin P17 may include a plurality of pins corresponding to a plurality of data signals.

The memory interface circuit 230b may obtain the command CMD from the data signal DQ received in an enable section (e.g., a high level state) of the command latch enable signal CLE based on toggle timings of the write enable signal nWE. The memory interface circuit 230b may obtain the address ADDR from the data signal DQ received in an enable section (e.g., a high level state) of the address latch enable signal ALE based on the toggle timings of the write enable signal nWE.

In some embodiments, the write enable signal nWE may be maintained in a static state (e.g., a high level or a low level), and then toggle between a high level and a low level. For example, the write enable signal nWE may toggle in a section in which the command CMD or the address ADDR is transmitted. Accordingly, the memory interface circuit 230b may obtain the command CMD or the address ADDR based on the toggle timings of the write enable signal nWE.

The memory interface circuit 230b may receive a read enable signal nRE from the device controller 210 through the fifth pin P15. The memory interface circuit 230b may receive a data strobe signal DQS from the device controller 210 or transmit a data strobe signal DQS to the device controller 210 through the sixth pin P16.

In a data output operation of the storage device 224, the memory interface circuit 230b may receive the toggling read enable signal nRE through the fifth pin P15 before outputting the data DATA. The memory interface circuit 230b may generate the toggling data strobe signal DQS based on the toggling of the read enable signal nRE. For example, the memory interface circuit 230b may generate the data strobe signal DQS starting to toggle after a delay (e.g., tDQSRE) predefined on the basis of a toggling start time of the read enable signal nRE. The memory interface circuit 230b may transmit the data signal DQ including the data DATA based on a toggle timing of the data strobe signal DQS. Accordingly, the data DATA may be aligned with the toggle timing of the data strobe signal DQS and transmitted to the device controller 210.

In a data input operation of the storage device 224, when the data signal DQ including the data DATA is received from the device controller 210, the memory interface circuit 230b may receive the toggling data strobe signal DQS together with the data DATA from the device controller 210. The memory interface circuit 230b may obtain the data DATA from the data signal DQ based on the toggle timing of the data strobe signal DQS. For example, the memory interface circuit 230b may obtain the data DATA by sampling the data signal DQ at a rising edge and a falling edge of the data strobe signal DQS.

The memory interface circuit 230b may transmit a ready/busy output signal nR/B to the device controller 210 through the eighth pin P18. The memory interface circuit 230b may transmit state information of the storage device 224 to the device controller 210 through the ready/busy output signal nR/B. When the storage device 224 is in a busy state (e.g., when internal operations of the storage device 224 are being performed), the memory interface circuit 230b may transmit the ready/busy output signal nR/B indicating the busy state to the device controller 210. When the storage device 224 is in a ready state (e.g., when internal operations of the storage device 224 are not performed or have been completed), the memory interface circuit 230b may transmit the ready/busy output signal nR/B indicating the ready state to the device controller 210. For example, while the storage device 224 reads the data DATA from the memory cell array 520 in response to a page read command, the memory interface circuit 230b may transmit the ready/busy output signal nR/B indicating the busy state (e.g., a low level) to the device controller 210. For example, while the storage device 224 programs the data DATA in the memory cell array 520 in response to a program command, the memory interface circuit 230b may transmit the ready/busy output signal nR/B indicating the busy state to the device controller 210.

The control logic circuit 510 may generally control various operations of the storage device 224. The control logic circuit 510 may receive the command/address CMD/ADDR obtained from the memory interface circuit 230b. The control logic circuit 510 may generate control signals for controlling other components of the storage device 224 according to the received command/address CMD/ADDR. For example, the control logic circuit 510 may generate various control signals for programming the data DATA in the memory cell array 520 or reading the data DATA from the memory cell array 520.

The memory cell array 520 may store the data DATA obtained from the memory interface circuit 230b under the control of the control logic circuit 510. The memory cell array 520 may output the stored data DATA to the memory interface circuit 230b under the control of the control logic circuit 510.

The memory cell array 520 may include a plurality of memory cells. For example, the plurality of memory cells may be flash memory cells. However, embodiments of the present disclosure are not limited thereto. For example, in some embodiments, the memory cells may be, for example, resistive random access memory (RRAM) cells, ferroelectric random access memory (FRAM) cells, phase change random access memory (PRAM) cells, thyristor random access memory (TRAM) cells, or magnetic random access memory (MRAM) cells. Hereinafter, embodiments of the present disclosure will be described with a focus on an embodiment in which the memory cells are NAND flash memory cells.

The device controller 210 may include first to eighth pins P21 to P28 and the controller interface circuit 230a. The first to eighth pins P21 to P28 may correspond to the first to eighth pins P11 to P18 of the storage device 224, respectively.

The controller interface circuit 230a may transmit the chip enable signal nCE to the storage device 224 through the first pin P21. The controller interface circuit 230a may transmit and receive signals to and from the storage device 224 selected through the chip enable signal nCE through the second to eighth pins P22 to P28.

The controller interface circuit 230a may transmit the command latch enable signal CLE, the address latch enable signal ALE, and the write enable signal nWE to the storage device 224 through the second to fourth pins P22 to P24. The controller interface circuit 230a may transmit the data signal DQ to the storage device 224 or receive the data signal DQ from the storage device 224 through the seventh pin P27.

The controller interface circuit 230a may transmit the data signal DQ including the command CMD or the address ADDR together with the toggling write enable signal nWE to the storage device 224. The controller interface circuit 230a may transmit the data signal DQ including the command CMD to the storage device 224 as it transmits the command latch enable signal CLE having an enable state, and transmit the data signal DQ including the address ADDR to the storage device 224 as it transmits the address latch enable signal ALE having an enable state.

The controller interface circuit 230a may transmit the read enable signal nRE to the storage device 224 through the fifth pin P25. The controller interface circuit 230a may receive the data strobe signal DQS from the storage device 224 or transmit the data strobe signal DQS to the storage device 224 through the sixth pin P26.

In the data output operation of the storage device 224, the controller interface circuit 230a may generate the toggling read enable signal nRE and transmit the read enable signal nRE to the storage device 224. For example, the controller interface circuit 230a may generate the read enable signal nRE changed from a fixed state (e.g., a high level or a low level) to a toggle state before the data DATA is output. Accordingly, the toggling data strobe signal DQS may be generated based on the read enable signal nRE in the storage device 224. The controller interface circuit 230a may receive the data signal DQ including the data DATA together with the toggling data strobe signal DQS from the storage device 224. The controller interface circuit 230a may obtain the data DATA from the data signal DQ based on the toggle timing of the data strobe signal DQS.

In the data input operation of the storage device 224, the controller interface circuit 230a may generate the toggling data strobe signal DQS. For example, the controller interface circuit 230a may generate the data strobe signal DQS changed from a fixed state (e.g., a high level or a low level) to a toggle state before transmitting the data DATA. The controller interface circuit 230a may transmit the data signal DQ including the data DATA to the storage device 224 based on the toggle timings of the data strobe signal DQS.

The controller interface circuit 230a may receive the ready/busy output signal nR/B from the storage device 224 through the eighth pin P28. The controller interface circuit 230a may determine the state information of the storage device 224 based on the ready/busy output signal nR/B.

Figure 6:
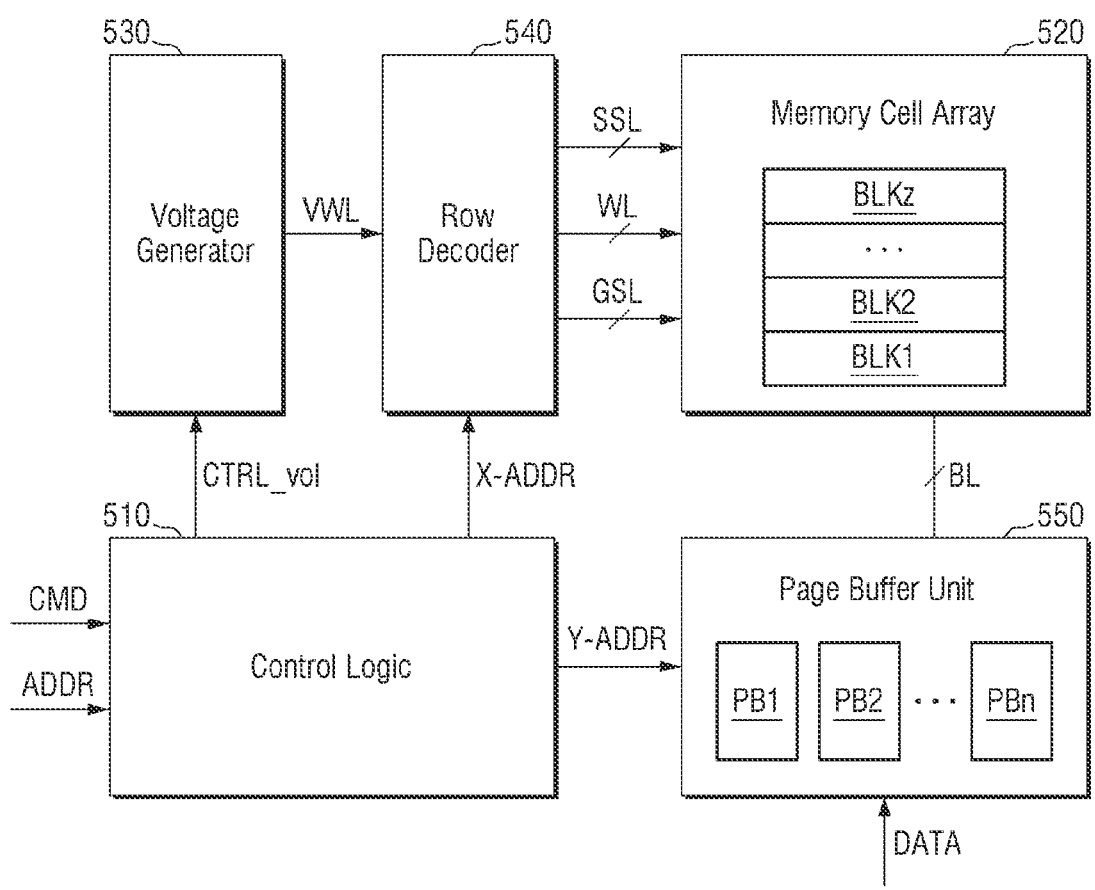
FIG. 6 is an illustrative block diagram illustrating a storage device of FIG. 5 according to some embodiments.

FIG. 6 is an illustrative block diagram illustrating a storage device of FIG. 5 according to some embodiments.

Referring to FIG. 6, the storage device 224 may include a control logic circuit 510, a memory cell array 520, a page buffer unit 550, a voltage generator 530, and a row decoder 540. In some embodiments, the storage device 224 may further include the memory interface circuit 230b illustrated in FIG. 5, and may further include, for example, a column logic, a pre-decoder, a temperature sensor, a command decoder, an address decoder, etc.

The control logic circuit 510 may generally control various operations in the storage device 224. The control logic circuit 510 may output various control signals in response to the command CMD and/or the address ADDR from the memory interface circuit 230b. For example, the control logic circuit 510 may output a voltage control signal CTRL_vol, a row address X-ADDR, and a column address Y-ADDR.

The memory cell array 520 may include a plurality of memory blocks BLK1 to BLKz, where z is a positive integer, each of which may include a plurality of memory cells. The memory cell array 520 may be connected to the page buffer unit 550 through bit lines BL, and may be connected to the row decoder 540 through word lines WL, string selection lines SSL, and ground selection lines GSL.

In an embodiment, the memory cell array 520 may include a three-dimensional (3D) memory cell array, and the 3D memory cell array may include a plurality of NAND strings. Each NAND string may include memory cells each connected to word lines vertically stacked on a substrate. U.S. Pat. Nos. 7,679,133, 8,553,466, 8,654,587, 8,559,235, and U.S. Patent Application Publication No. 2011/0233648 are incorporated herein by reference. In an embodiment, the memory cell array 520 may include a two-dimensional (2D) memory cell array, and the 2D memory cell array may include a plurality of NAND strings arranged along row and column directions.

The page buffer unit 550 may include a plurality of page buffers PB1 to PBn, where n is a positive integer equal to 3 or more, and the plurality of page buffers PB1 to PBn may be connected, respectively, to the memory cells through a plurality of bit lines BL. The page buffer unit 550 may select at least one of the bit lines BL in response to the column address Y-ADDR. The page buffer unit 550 may operate as a write driver or a sense amplifier according to an operation mode. For example, at the time of a program operation, the page buffer unit 550 may apply a bit line voltage corresponding to data to be programmed to the selected bit line. At the time of a read operation, the page buffer unit 550 may sense a current or voltage of the selected bit line to sense data stored in the memory cell.

The voltage generator 530 may generate various types of voltages for performing program, read, and erase operations based on the voltage control signal CTRL_vol. For example, the voltage generator 530 may generate a program voltage, a read voltage, a program verification voltage, an erase voltage, etc., as word line voltages VWL.

The row decoder 540 may select one of a plurality of word lines WL and may select one of a plurality of string selection lines SSL in response to the row address X-ADDR. For example, the row decoder 540 may apply the program voltage and the program verification voltage to the selected word line at the time of the program operation, and may apply the read voltage to the selected word line at the time of the read operation.

Figure 7:
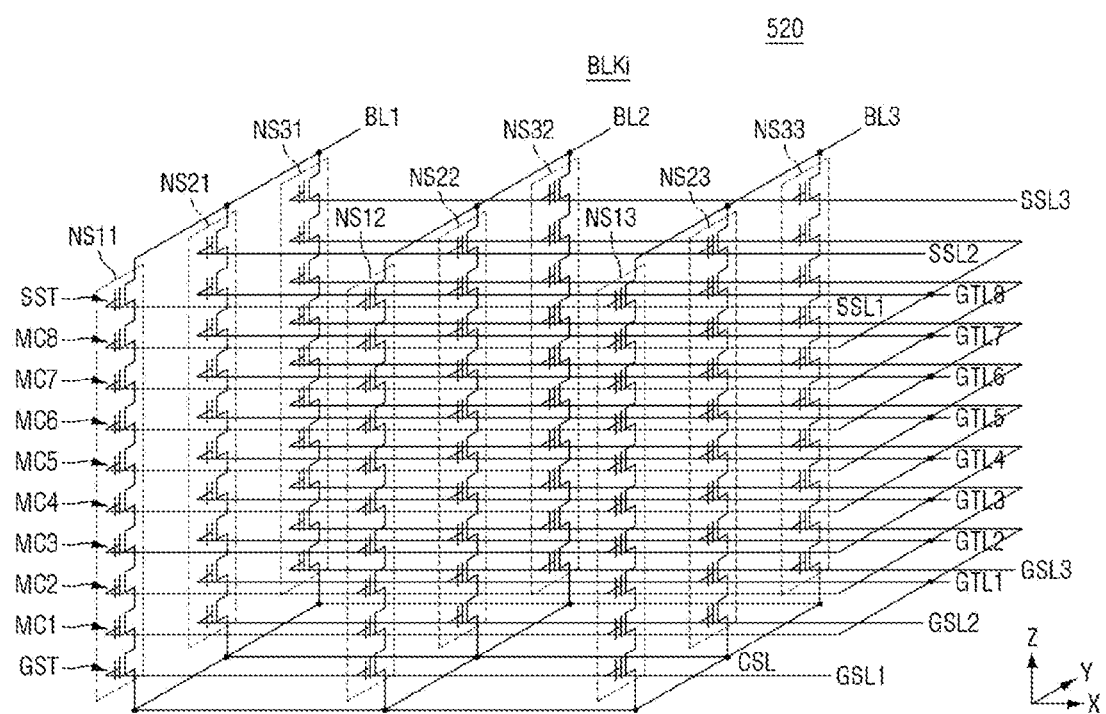
FIG. 7 is a diagram illustrating a three-dimensional (3D) V-NAND structure according to some embodiments.

FIG. 7 is a diagram illustrating a three-dimensional (3D) V-NAND structure according to some embodiments.

When the storage module of a UFS device is implemented as a 3D V-NAND-type flash memory, each of a plurality of memory blocks constituting the storage module may be represented by an equivalent circuit as illustrated in FIG. 7.

A memory block BLKi illustrated in FIG. 7 is a three-dimensional memory block formed in a three-dimensional structure on a substrate. For example, a plurality of memory NAND strings included in the memory block BLKi may be formed in a direction perpendicular to the substrate.

Referring to FIG. 7, the memory block BLKi may include a plurality of memory NAND strings NS11 to NS33 connected between bit lines BL1, BL2, and BL3 and a common source line CSL. Each of the plurality of memory NAND strings NS11 to NS33 may include a string selection transistor SST, a plurality of memory cells MC1, MC2, . . . , MC8, and a ground selection transistor GST. It has been illustrated in FIG. 6 that each of the plurality of memory NAND strings NS11 to NS33 includes eight memory cells MC1, MC2, . . . , MC8, but embodiments of the present disclosure are not necessarily limited thereto.

The string selection transistor SST may be connected to a corresponding string selection line SSL1, SSL2, or SSL3. The plurality of memory cells MC1, MC2, . . . , MC8 may be connected to corresponding gate lines GTL1, GTL2, . . . , GTL8, respectively. The gate lines GTL1, GTL2, . . . , GTL8 may correspond to word lines, and some of the gate lines GTL1, GTL2, . . . , GTL8 may correspond to dummy word lines. The ground selection transistor GST may be connected to a corresponding ground selection line GSL1, GSL2, or GSL3. The string selection transistor SST may be connected to a corresponding bit line BL1, BL2, or BL3, and the ground selection transistor GST may be connected to the common source line CSL.

Word lines (for example, WL1) having the same height may be connected in common, and the ground selection lines GSL1, GSL2, and GSL3 and the string selection lines SSL1, SSL2, and SSL3 may be separated from each other, respectively. It has been illustrated in FIG. 7 that the memory block BLKi is connected to eight gate lines GTL1, GTL2, GTL8 and three bit lines BL1, BL2, and BL3, but embodiments of the present disclosure are not necessarily limited thereto.

Figure 8:
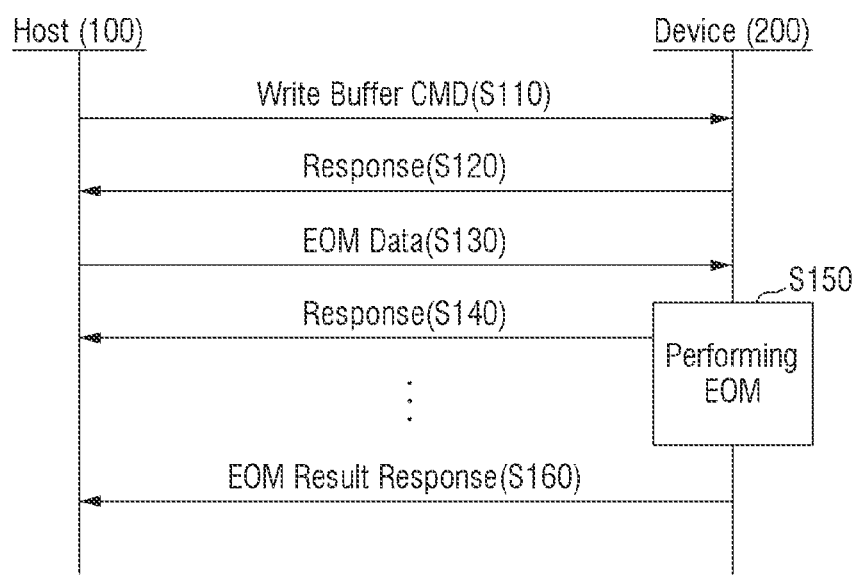
FIG. 8 is a flowchart illustrating an operation of a memory system according to some embodiments.

FIG. 8 is a flowchart illustrating an operation of a memory system according to some embodiments. FIGS. 9 to 14 are diagrams for describing an operation of a memory system according to some embodiments.

First, referring to FIG. 8, the host device 100 transmits a command for requesting the memory device 200 to perform an eye open monitor (EOM) operation to the memory device 200 (S110).

In some embodiments, such a request command may be implemented in the form of a WRITE BUFFER COMMAND illustrated in FIG. 9 according to a JEDEC UFS standard. FIG. 9 is a diagram illustrating a command descriptor block (CDB) of the WRITE BUFFER COMMAND according to the JEDEC UFS standard, and FIG. 10 is a diagram illustrating set values of a mode field Mode of the WRITE BUFFER COMMAND.

For example, referring to FIGS. 1, 9, and 10, the UFS host controller 110 of the host device 100 may request the UFS device controller 210 of the memory device 200 to perform an EOM operation by setting a mode field Mode of the WRITE BUFFER COMMAND to 1F. In addition, the UFS device controller 210 receiving such a request may prepare for the EOM operation.

In some embodiments, operations of the UFS host controller 110 and operations of the UFS device controller 210 may be performed by controlling the UFS host controller 110 and the UFS device controller 210 by predetermined firmware, but embodiments are not limited thereto.

Referring to FIG. 10, an embodiment in which the UFS device controller 210 requests to perform the EOM operation when a set value of the mode field Mode of the WRITE BUFFER COMMAND is 1F is illustrated, but embodiments of the present disclosure are not limited thereto. For example, in some embodiments, the set value of the mode field Mode for requesting the UFS device controller 210 to perform the EOM operation may be modified into other set values (e.g., other set values set as reserved in standard specifications, such as 1D and 1E).

Referring to FIGS. 1 and 9, the UFS host controller 110 may transfer a size of EOM data, which is described in further detail below, to the UFS device controller 210 using a parameter list length field PARAMETER LIST LENGTH of the WRITE BUFFER COMMAND.

Then, referring to FIG. 8, the memory device 200 transmits a response to the WRITE BUFFER COMMAND to the host device 100 (S120).

In some embodiments, such a response may include receivable data capacity information of the memory device 200. That is, when the memory device 200 responds to the host device 100 with, for example, k bytes, where k is a natural number, the host device 100 may divide and transmit data to be subsequently transmitted to the memory device 200 (e.g., data utilized for performing the EOM operation) in units of k bytes.

Then, referring to FIG. 8, the host device 100 transmits generated EOM data to the memory device 200 (S130), and the memory device 200 transmits a response to reception of the EOM data to the host device 100 (S140).

In some embodiments, the host device 100 may generate the EOM data utilized for the EOM operation to be performed in the memory device 200.

A generation point in time of the EOM data may be earlier than a point in time corresponding to S110 when the host device 100 transmits the command for requesting the memory device 200 to perform the EOM operation to the memory device 200, or may be later than a point in time corresponding to S120 when the host device 100 receives the response to the WRITE BUFFER COMMAND from the memory device 200.

Alternatively, in some embodiments, a generation point in time of the EOM data may be between a point in time corresponding to S110 when the host device 100 transmits the command for requesting the memory device 200 to perform the EOM operation to the memory device 200 and a point in time corresponding to S120 when the host device 100 receives the response to the WRITE BUFFER COMMAND from the memory device 200. That is, a timing when the host device 100 generates the EOM data utilized for the EOM operation to be performed in the memory device 200 may be variously modified.

In some embodiments, the EOM data generated by the host device 100 may include parameters utilized for performing the EOM operation and pattern data utilized for performing the EOM operation.

In some embodiments, the parameter utilized for performing the EOM operation may include the offset values dX and dY for performing the EOM operation of the memory device 200 described above.

The offset value dX may include, for example, a time offset value, a phase offset value, etc., and the offset value dY may include, for example, a voltage offset value, but embodiments are not limited thereto.

In addition, the parameter utilized for performing the EOM operation may include, for example, phase resolution information. Such phase resolution information may be used for the memory device 200 to receive the pattern data from the host device 100.

In some embodiments, the pattern data utilized for performing the EOM operation may be the serial bit SB (see FIG. 3) provided from the host device 100, which is utilized for performing the EOM operation of the memory device 200 described above.

In some embodiments, the host device 100 may generate a plurality of pattern data, and the plurality of pattern data may be generated by as many combinations of bit sequences as possible and be generated using data patterns in which results of performing the EOM operation are consistent.

Examples of such pattern data may include pseudorandom binary sequence (PRBS) data, compliant random test pattern (CRPAT) data, compliant jitter tolerance pattern (CJTPAT) data, etc., but embodiments are not limited thereto.

FIG. 11 is a diagram illustrating a structure of EOM data transmitted by the host device 100 to the memory device 200 according to some embodiments.

Referring to FIG. 11, the EOM data may include an EOM data header EDH and an EOM data pattern EDP.

The EOM data header EDH may include parameters utilized for performing the EOM operation. For example, a phase selection field PHASE SELECT may include a time offset value or a phase offset value to be transferred to the memory device 200, and a reference voltage control field VREF CONTROL may include a voltage offset value to be transferred to the memory device 200.

That is, the time offset value or the phase offset value utilized for the memory device 200 to perform the EOM operation described above with reference to FIGS. 3 and 4 may be provided from the host device 100 to the memory device 200 through the phase selection field PHASE SELECT. In addition, the voltage offset value utilized for the memory device 200 to perform the EOM operation described above with reference to FIGS. 3 and 4 may be provided from the host device 100 to the memory device 200 through the reference voltage control field VREF CONTROL.

The phase resolution information (e.g., gear information) referred to for the memory device 200 to receive the pattern data from the host device 100 may be provided from the host device 100 to the memory device 200 through a phase resolution field PHASE RESOLUTION.

In addition, the number of sampling operations that the memory device 200 executes while performing the EOM operation may be provided from the host device 100 to the memory device 200 through a number-of-sampling field NUMBER OF SAMPLING.

In addition, a size of the pattern data to be received by the memory device 200 from the host device 100 may be provided from the host device 100 to the memory device 200 through a data length field EOM DATA LENGTH.

Although an example of the EOM data header EDH including 12 bytes is illustrated in FIG. 11, embodiments are not limited thereto, and a size of the EOM data header EDH may be variously modified.

The EOM data pattern EDP may include pattern data utilized for performing the EOM operation. As illustrated in FIG. 11, the EOM data pattern EDP may include a plurality of pattern data. In some embodiments, N illustrated in FIG. 11 may be a natural number greater than 12.

Figure 12:
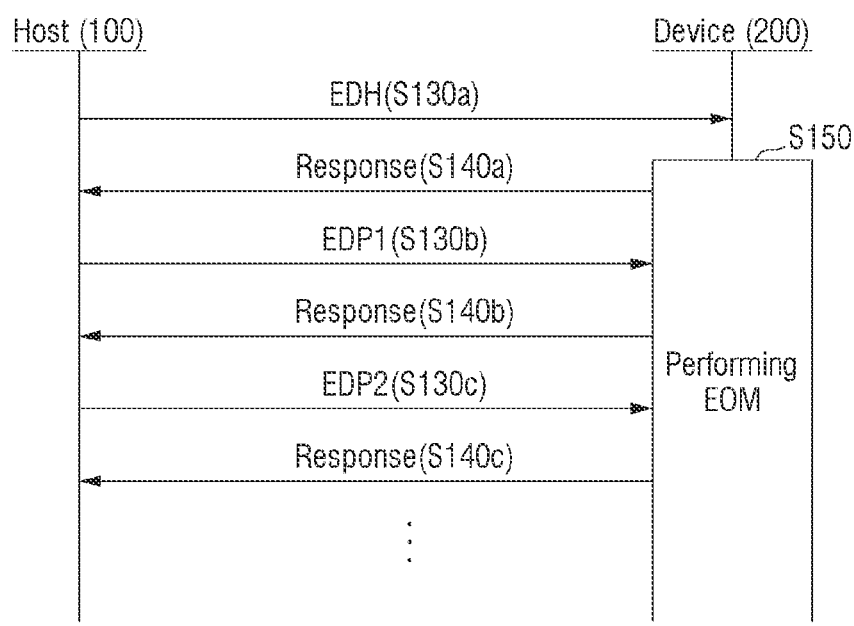

Referring to FIG. 12, the EOM data header EDH and the EOM data pattern EDP may be transmitted from the host device 100 to the memory device 200 multiple times. In this case, in determining a method of transmitting the EOM data header EDH and the EOM data pattern EDP to the memory device 200 by the host device 100, the receivable data capacity information transmitted by the memory device 200 to the host device 100 as the response in S120 of FIG. 8 may be considered.

For example, assuming that the receivable data capacity information transmitted by the memory device 200 to the host device 100 as the response in S110 of FIG. 8 is 12 bytes, the host device 100 may transmit the EOM data header EDH and the EOM data pattern EDP to the memory device 200 using a method according to FIG. 12.

For example, in some embodiments, the host device 100 first transmits an EOM data header EDH having a size of 12 bytes to the memory device 200 (S130a). Then, the memory device 200 transmits a response indicating that the EOM data header EDH has been received to the host device 100 (S140a).

Then, the host device 100 transmits an EOM data pattern EDP having a size of 12 bytes among EOM data patterns EDP to the memory device 200 (S130b). Then, the memory device 200 transmits a response indicating that the EOM data pattern EDP has been received to the host device 100 (S140b). Then, the host device 100 transmits a subsequent EOM data pattern EDP having a size of 12 bytes among the EOM data patterns EDP to the memory device 200 (S130c). Then, the memory device 200 transmits a response indicating that the EOM data pattern EDP has been received to the host device 100 (S140c). By repeating these operations, all of the EOM data patterns EDP illustrated in FIG. 12 may be provided from the host device 100 to the memory device 200.

The structure of the EOM data transmitted by the host device 100 to the memory device 200 is not limited to the example illustrated in FIG. 11.

FIG. 13 is a diagram illustrating a structure of EOM data transmitted by a host device 100 to a memory device 200 according to some embodiments.

Referring to FIG. 13, the EOM data may include an EOM data header EDH and an EOM data pattern EDP.

The EOM data header EDH may include parameters utilized for performing the EOM operation.

For example, a timing offset field Timing Offset and a timing step field Timing Step may include a time offset value or a phase offset value to be transferred to the memory device 200, and a voltage offset field Voltage Offset and a voltage step field Voltage Step may include a voltage offset value to be transferred to the memory device 200.

That is, the time offset value or the phase offset value utilized for the memory device 200 to perform the EOM operation described above with reference to FIGS. 3 and 4 may be provided from the host device 100 to the memory device 200 through the timing offset field Timing Offset and the timing step field Timing Step. In addition, the voltage offset value utilized for the memory device 200 to perform the EOM operation described above with reference to FIGS. 3 and 4 may be provided from the host device 100 to the memory device 200 through the voltage offset field Voltage Offset and the voltage step field Voltage Step.

That is, in some embodiments, the offset value dX and the offset value dY illustrated in FIGS. 3 and 4 are not expressed as one value as in an embodiment illustrated in FIG. 11, but rather, are expressed as two fields: a reference value (a reference phase or a reference voltage) and an offset value (an offset phase value or a offset voltage value) with respect to the reference value.

The number of sampling operations that the memory device 200 executes while performing the EOM operation may be provided from the host device 100 to the memory device 200 through a number-of-sampling field Number of Sampling.

In addition, a size of the pattern data to be received by the memory device 200 from the host device 100 may be provided from the host device 100 to the memory device 200 through a data length field Total Data Length.

Referring back to FIG. 8, the memory device 200 receiving the EOM data performs the EOM operation (S150).

In some embodiments, such an EOM operation may be performed after the EOM data header EDH (see FIG. 12) is received and while the EOM data pattern EDP (see FIG. 11) is received. However, embodiments are not limited thereto, and the EOM operation may also be performed after all of the EOM data patterns EDP (see FIG. 12) are received.

Referring back to FIGS. 1 to 4, the EOM block 255 may perform the operation described above with reference to FIGS. 3 and 4 whenever one pattern data is received from the host device 100. That is, the error count signal EC and the sampling count signal SC may be output for each received pattern data.

The sampling count signal SC may be used to determine whether the number of sampling operations of the number-of-sampling field NUMBER OF SAMPLING provided from the host device 100 to the memory device 200 is the same as the number of sampling operations performed by the memory device 200.

The error count signal EC may be used to calculate an error count value corresponding to the phase offset value provided through the phase selection field PHASE SELECT and the voltage offset value provided through the reference voltage control field VREF CONTROL for all pattern data received from the host device 100.

For example, assuming that the host device 100 has transmitted one hundred pieces of pattern data for the memory device 200 to perform the EOM operation and the number of error count signals EC output by the EOM block 255 receiving the one hundred pieces of pattern data is 30, the error count value according to the performance of the EOM operation may be 30. Such an error count value may be used to calculate an error rate (e.g., 30% in the present example).

Referring back to FIG. 8, the memory device 200 that has performed the EOM operation transmits a response signal including a result of performing the EOM operation to the host device 100 (S160).

In this case, the response signal may include information indicating whether the performance of the EOM operation has been successful, the error count value corresponding to the phase offset value and the voltage offset value, and the parameters utilized for performing the EOM operation.

For example, when the number of sampling operations of the number-of-sampling field NUMBER OF SAMPLING provided from the host device 100 to the memory device 200 is the same as the number of sampling count signals SC output by the comparator 255b of the memory device 200, the memory device 200 may determine that the performance of the EOM operation has been completed and transmit complete information to the host device 100.

Alternatively, when the number of sampling operations of the number-of-sampling field NUMBER OF SAMPLING provided from the host device 100 to the memory device 200 is different from the number of sampling count signals SC output by the comparator 255*b* of the memory device 200, the memory device 200 may determine that the performance of the EOM operation has not been completed and transmit failure information to the host device 100.

In some embodiments, the information indicating whether the performance of the EOM operation has been successful may be provided to the host device 100 through a response field Response illustrated in FIG. 14, but embodiments are not limited thereto.

In addition, in some embodiments, the error count values described above may be provided to the host device 100 through, for Example, four sense data fields Sense Data[0], Sense Data[1], Sense Data[2], and Sense Data[3] illustrated in FIG. 14, but embodiments are not limited thereto.

In addition, in some embodiments, the parameters (e.g., the time offset value, the phase offset value, the voltage offset value, the information on the number of sampling operations, etc.) stored in the memory device 200 and utilized for performing the EOM operation may be provided to the host device 100 through, for example, fourteen sense data fields Sense Data[4] to Sense Data[17] illustrated in FIG. 14, but embodiments are not limited thereto.

In addition, in some embodiments, the response signal may include preset information. Such preset information may be referred to and be used to change signal driving characteristics of the host device 100 or change signal reception characteristics of the memory device 200.

In the memory system described above according to embodiments of the present disclosure, a separate external device to be attached to or detached from the memory device 200 to determine quality characteristics of signals transmitted and received between the host device 100 and the memory device 200 may be omitted, and the quality characteristics of the signals may be determined without utilization of such a separate external device. Further, in some embodiments, a signal line on which the EOM operation is performed is the same as a signal line on which the host device 100 and the memory device 200 exchange signals with each other. Accordingly, the EOM operation may be efficiently and reliably performed.

Figure 15:
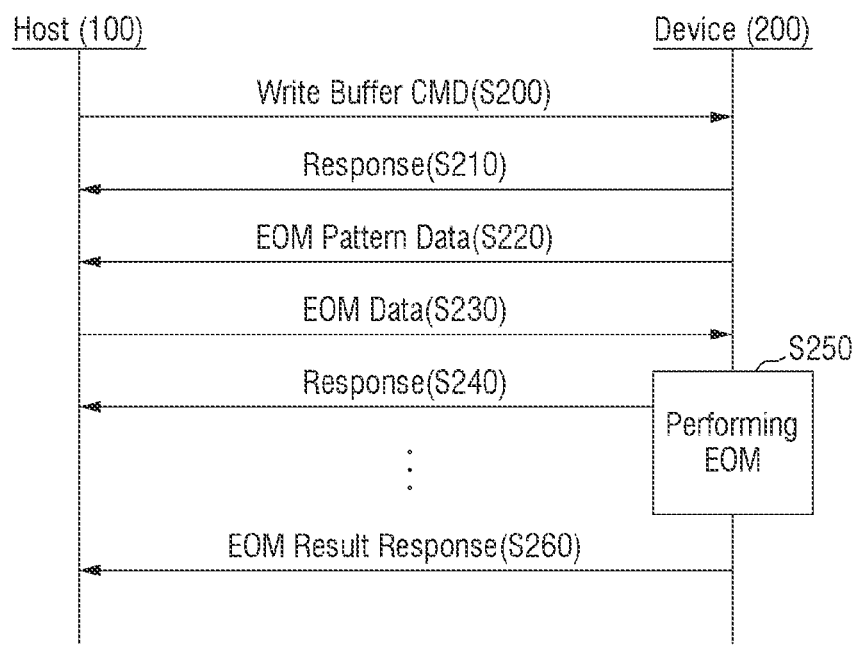
FIG. 15 is a flowchart illustrating an operation of a memory system according to some embodiments.

FIG. 15 is a flowchart illustrating an operation of a memory system according to some embodiments.

Hereinafter, for convenience of explanation, a further description of elements and technical aspects previously described may be omitted, and the description will focus primarily on differences from embodiments described above.

Referring to FIG. 15, the host device 100 transmits a command for requesting the memory device 200 to perform an EOM operation to the memory device 200 (S200). Then, the memory device 200 transmits a response to the WRITE BUFFER COMMAND to the host device 100 (S210).

Next, the memory device 200 transmits pattern data utilized to perform the EOM operation to the host device 100 (S220).

Referring back to FIG. 1, in some embodiments, the pattern data utilized to perform such an EOM operation may be stored in the nonvolatile memory storage 220 of the memory device 200 and then transmitted to the host device 100, but embodiments are not limited thereto.

That is, unlike an embodiment described above with reference to FIG. 8, in an embodiment according to FIG. 15, the host device 100 does not generate the pattern data utilized to perform the EOM operation, and rather, the pattern data stored in the memory device 200 may be used to perform the EOM operation.

Then, the host device 100 transmits EOM data including parameters utilized for performing the EOM operation and the pattern data received from the memory device 200 to the memory device 200 (S230). Then, the memory device 200 transmits a response to reception of the EOM data to the host device 100 (S240). The memory device 200 receiving the EOM data performs the EOM operation (S250), and the memory device 200 that has performed the EOM operation transmits a response signal including a result of performing the EOM operation to the host device 100 (S260).

Figure 16:
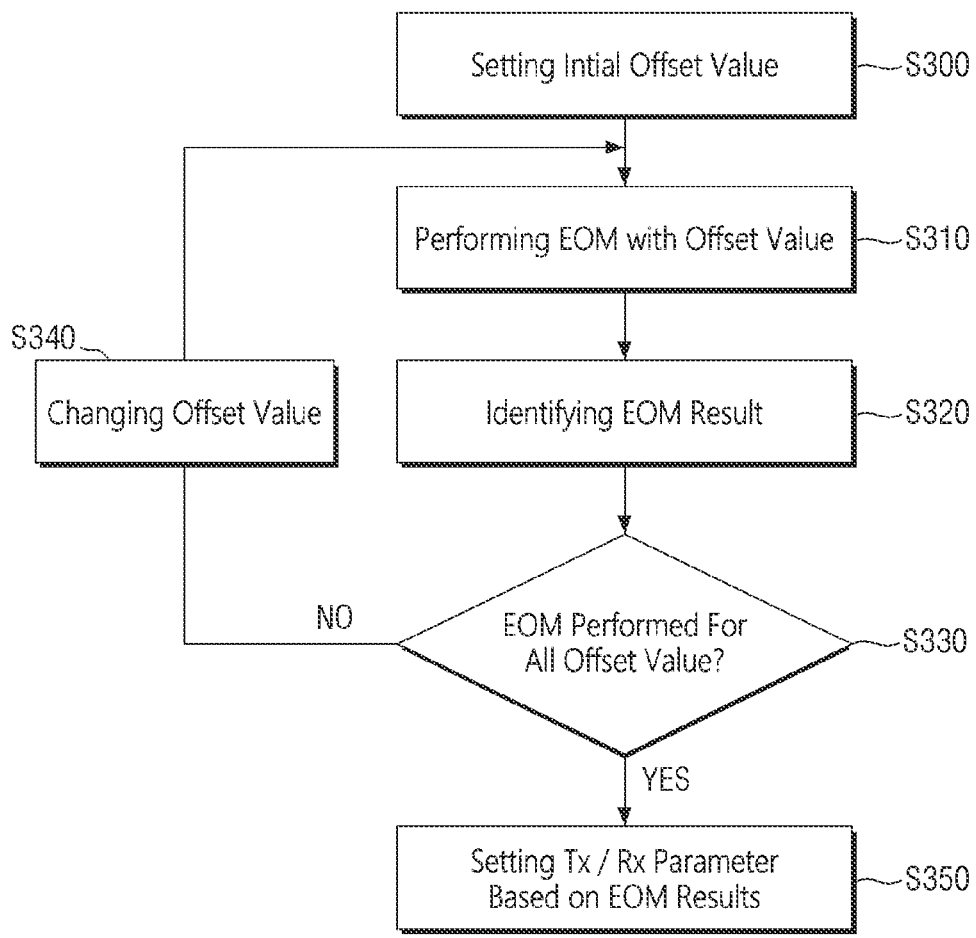
FIG. 16 is a flowchart illustrating a method of performing an EOM operation according to some embodiments.

FIG. 16 is a flowchart illustrating a method of performing an EOM operation according to some embodiments.

Referring to FIG. 16, an initial offset value is set (S300).

For example, referring to FIGS. 1 and 12, the host device 100 may set the offset values to be included in the EOM data header EDH (e.g., a value to be included in the phase selection field PHASE SELECT and/or a value to be included in the reference voltage control field VREF CONTROL), which are the parameters utilized for performing the EOM operation.

Then, the EOM operation is performed with the set offset value (S310). Then, an EOM result is identified (S320).

For example, the host device 100 and the memory device 200 may perform the EOM operation with the offset value described above and identify the EOM result.

When the EOM operation has not been performed for all offset values (NO in S330), the offset value is changed (S340), the EOM operation is performed with the changed offset value (S310), and an EOM result is identified (S320). That is, the EOM operation may be performed for a sufficient number of offset values to determine quality characteristics of signals transmitted and received between the host device 100 and the memory device 200.

When the EOM operation has been performed for all offset values (YES in S330), transmit parameters of a transmit end and receive parameters of a receive end of the host device 100 and the memory device 200 are set based on the EOM results (S350).

For example, the host device 100 may set transmit parameters of a transmit end related to signal transmission based on the EOM results, and then store the set transmit parameters in, for example, a PHY register of the host device 100.

In addition, the memory device 200 may also set receive parameters related to signal reception based on the EOM results, and then store the set receive parameters in, for example, a PHY register of the memory device 200.

In some embodiments, such receive parameters may be, for example, a CDR bandwidth, an amplitude of a receive end (TX/RX amplitude), etc., but embodiments are not limited thereto.

Figure 17:
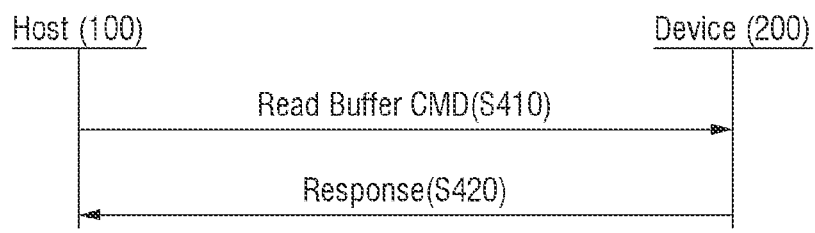
FIG. 17 is a flowchart illustrating an operation of a memory system according to some embodiments.

FIG. 17 is a flowchart illustrating an operation of a memory system according to some embodiments. FIGS. 18 to 25 are diagrams for describing an operation of a memory system according to some embodiments.

First, referring to FIG. 17, the host device 100 transmits a command for requesting information related to an EOM operation to the memory device 200 (S410).

In some embodiments, such a request command may be implemented in the form of a READ BUFFER COMMAND illustrated in FIG. 18 according to the JEDEC UFS standard. FIG. 18 is a diagram illustrating a command descriptor block (CDB) of the READ BUFFER COMMAND according to the JEDEC UFS standard.

In some embodiments, the information related to the EOM operation that the host device 100 requests from the memory device 200 using the READ BUFFER COMMAND may refer to, for example, information related to the EOM operation performed in the memory device 200 by the WRITE BUFFER COMMAND described above (e.g., the parameters utilized for performing the EOM operation, such as the offset information stored in the memory device 200 and the error count). However, embodiments are not limited thereto.

First, referring to FIGS. 1, 10, and 18, the UFS host controller 110 of the host device 100 may request the information related to the EOM operation from the UFS device controller 210 of the memory device 200 by setting a mode field Mode of the READ BUFFER COMMAND to 1F.

In some embodiments, operations of the UFS host controller 110 and operations of the UFS device controller 210 may be performed by controlling the UFS host controller 110 and the UFS device controller 210 by predetermined firmware, but embodiments are not limited thereto.

A value of the mode field Mode of the READ BUFFER COMMAND may be defined, for example, as described with reference to FIG. 10 above. Accordingly, the host device 100 may request the information related to the EOM operation from the memory device 200 by setting a set value of the mode field Mode of the READ BUFFER COMMAND to 1F, but embodiments are not limited thereto.

The set value of the mode field Mode for requesting the information related to the EOM operation may be modified into other set values (e.g., other set values set as Reserved in standard specifications, such as 1D).

Then, referring to FIG. 17, the memory device 200 transmits a response signal including the information related to the EOM operation to the host device 100 in response to the command for requesting the information related to the EOM operation (S420).

In some embodiments, when the host device 100 requests the information related to the EOM operation from the memory device 200 through the READ BUFFER COMMAND, the host device 100 may include an indication field indicating information to be included in the response signal from the memory device 200 in the READ BUFFER COMMAND. Although an embodiment that uses a buffer ID field BUFFER ID of the READ BUFFER COMMAND as such an indication field is described herein, embodiments are not limited thereto.

The memory device 200 may identify the buffer ID field BUFFER ID of the READ BUFFER COMMAND received from the host device 100, and transmit a response signal including information corresponding to the buffer ID field BUFFER ID among the information related to the EOM operation to the host device 100.

Hereinafter, this process will be described in further detail with reference to FIGS. 19 to 25.

FIG. 19 is a diagram illustrating a description of set values of the buffer ID field BUFFER ID of the READ BUFFER COMMAND.

Referring to FIG. 19, when the host device 100 desires that an error count value for an offset value of a specific coordinate is included in the response signal from the memory device 200, the host device 100 may set the buffer ID field BUFFER ID of the READ BUFFER COMMAND to 00 and transmit the READ BUFFER COMMAND to the memory device 200.

In this case, some fields of the READ BUFFER COMMAND transmitted from the host device 100 to the memory device 200 may include an offset value of a specific coordinate, as illustrated in FIG. 20.

That is, the host device 100 may write X-axis coordinate information (X-axis offset information) and Y-axis coordinate information (Y-axis offset information) as illustrated in FIG. 20 in a buffer offset field BUFFER OFFSET of the READ BUFFER COMMAND of FIG. 18, and transmit the READ BUFFER COMMAND to the memory device 200. The memory device 200 that has received the READ BUFFER COMMAND may include an error count value ERR_CNT corresponding to the received X-axis coordinate information (X-axis offset information) and Y-axis coordinate information (Y-axis offset information) in the response signal, as illustrated in FIG. 21, and transmit the response signal to the host device 100, as a response to the reception of the READ BUFFER COMMAND.

For example, when the dX and dY offset values illustrated in FIG. 4 have been included in the READ BUFFER COMMAND received from the host device 100, the memory device 200 may include error count values for the dX and dY offset values in the response signal and transmit the response signal to the host device 100.

In some embodiments, the memory device 200 may transmit the response signal to the host device 100 based on a data capacity that may be transmitted between the memory device 200 and the host device 100 at a certain time. For example, when the data capacity that may be transmitted between the memory device 200 and the host device 100 at a certain time is 12 bytes, the memory device 200 may include the error count value ERR_CNT corresponding to the received X-axis coordinate information (X-axis offset information) and Y-axis coordinate information (Y-axis offset information) in the response signal and transmit the response signal to the host device 100 in units of 12 bytes.

Referring back to FIG. 19, when the host device 100 desires that the offset values of the EOM operation performed in the memory device 200 are included in the response signal from the memory device 200, the host device 100 may set the buffer ID field BUFFER ID of the READ BUFFER COMMAND to 01 and transmit the READ BUFFER COMMAND to the memory device 200.

For example, when the host device 100 desires that the parameters utilized for performing the EOM operation, such as the phase selection field PHASE SELECT, the reference voltage control field VREF CONTROL, and the number-of-sampling field NUMBER OF SAMPLING stored in the memory device 200 in an EOM performing process and included in the EOM data header EDH of FIG. 11 are included in the response signal, the host device 100 may set the buffer ID field BUFFER ID of the READ BUFFER COMMAND to 01 and transmit the READ BUFFER COMMAND to the memory device 200.

The memory device 200 that has received the READ BUFFER COMMAND may include the phase selection field PHASE SELECT, the reference voltage control field VREF CONTROL, the number-of-sampling field NUMBER OF SAMPLING, etc., stored in the memory device 200 in the EOM performing process in the response signal, as illustrated in FIG. 22, and transmit the response signal to the host device 100, as a response to the reception of the READ BUFFER COMMAND. In addition, in this case, the memory device 200 may include an error count value ERR_CNT of the EOM operation performed using the corresponding phase selection field PHASE SELECT, reference voltage control field VREF CONTROL, and number-of-sampling field NUMBER OF SAMPLING in the response signal and transmit the response signal to the host device 100.

The memory device 200 may transmit the response signal to the host device 100 based on a data capacity that may be transmitted between the memory device 200 and the host device 100 at a certain time. For example, when the data capacity that may be transmitted between the memory device 200 and the host device 100 at a certain time is 12 bytes, the memory device 200 may transmit the phase selection field PHASE SELECT, the reference voltage control field VREF CONTROL, and the number-of-sampling field NUMBER OF SAMPLING stored in the memory device 200 and the error count value ERR_CNT of the EOM operation performed using the phase selection field PHASE SELECT, the reference voltage control field VREF CONTROL, and the number-of-sampling field NUMBER OF SAMPLING to the host device 100, in units of 12 bytes.

Referring back to FIG. 19, when the host device 100 desires that the receive parameters of the receive end of the memory device 200 are included in the response signal from the memory device 200, the host device 100 may set the buffer ID field BUFFER ID of the READ BUFFER COMMAND to 02 and transmit the READ BUFFER COMMAND to the memory device 200.

As described above with reference to FIG. 16, after the EOM operation is performed, the receive parameters related to the signal reception, such as the CDR bandwidth and the amplitude (TX/RX amplitude) of the receive end, may be set based on the EOM results, in, for example, the PHY register of the receive end of the memory device 200.

For example, when the host device 100 desires that the receive parameters set in, for example, the PHY register of the memory device 200 as a result of performing the EOM operation are included in the response signal, the host device 100 may set the buffer ID field BUFFER ID of the READ BUFFER COMMAND to 02 and transmit the READ BUFFER COMMAND to the memory device 200.

The memory device 200 that has received the READ BUFFER COMMAND may include the receive parameters set in the PHY register of the memory device 200 in the response signal, as illustrated in FIG. 23, and transmit the response signal to the host device 100, as a response to the reception of the READ BUFFER COMMAND.

Figure 24:
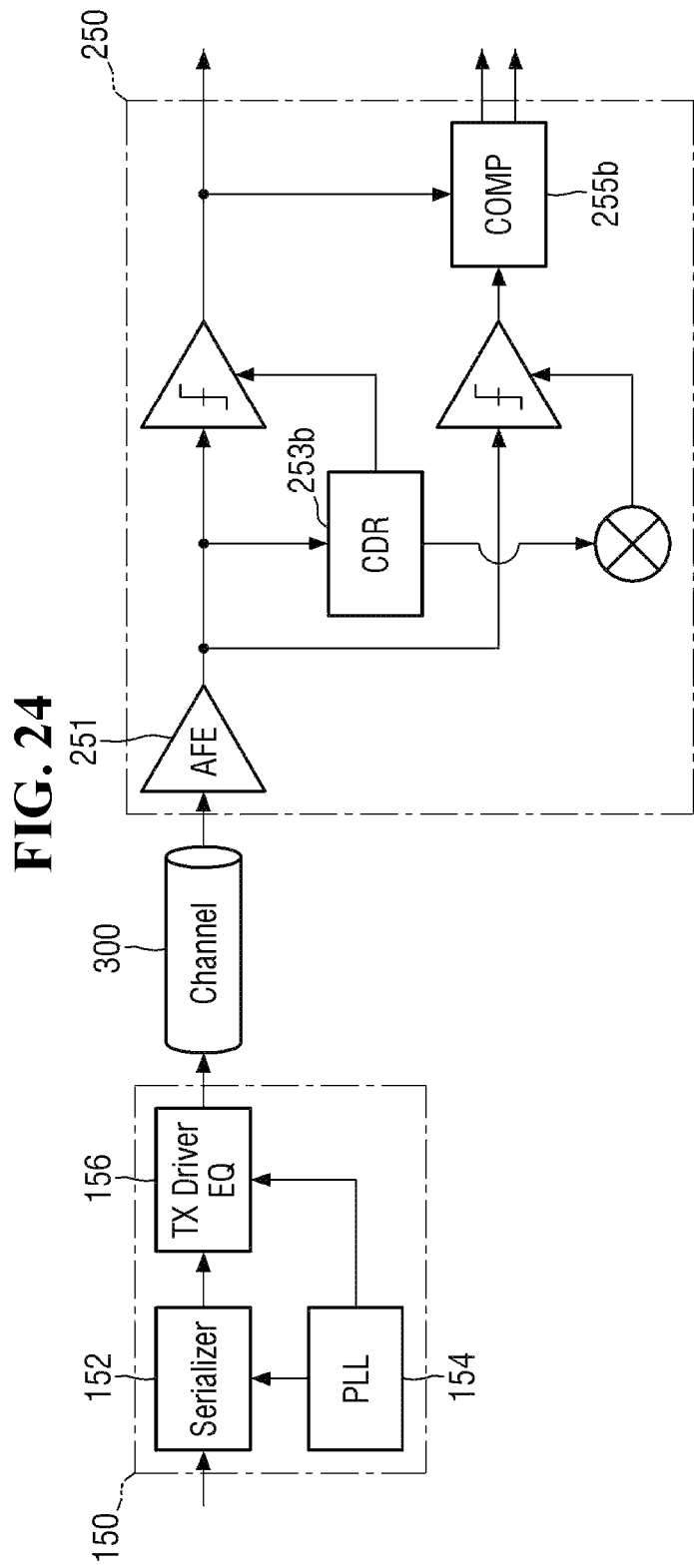

The receive parameters of the receive end of the memory device 200 may include, for example, a receive amplitude (RX amplitude) value setting a receive equalizer 251 included in a UIC layer 250 of a memory device 200 illustrated in FIG. 24, a CDR bandwidth setting a clock recovery circuit 253*b* of the memory device 200, etc., but embodiments are not limited thereto.

The transmit parameters of the transmit end of the host device 100 may include, for example, setting values for setting a serializer 152, a PLL 154, and a transmit equalizer 156 included in a UIC layer 150 of a host device 100 illustrated in FIG. 24, but embodiments are not limited thereto.

In addition, in this case, the memory device 200 may include the error count value ERR_CNT of the EOM operation performed in the memory device 200 in the response signal and transmit the response signal to the host device 100.

The memory device 200 may transmit the response signal to the host device 100 based on a data capacity that may be transmitted between the memory device 200 and the host device 100 at a certain time. For example, when the data capacity that may be transmitted between the memory device 200 and the host device 100 at a certain time is 12 bytes, the memory device 200 may transmit the receive parameters set in, for example, the PHY register of the memory device 200 and the error count value ERR_CNT of the EOM operation performed in the memory device 200 to the host device 100 in units of 12 bytes.

Referring back to FIG. 19, when the host device 100 desires that the parameters utilized for performing the EOM operation, such as the phase selection field PHASE SELECT, the reference voltage control field VREF CONTROL, and the number-of-sampling field NUMBER OF SAMPLING stored in the memory device 200 and the receive parameters of the receive end of the memory device 200 are included in the response signal from the memory device 200, the host device 100 may set the buffer ID field BUFFER ID of the READ BUFFER COMMAND to 03 and transmit the READ BUFFER COMMAND to the memory device 200.

That is, when both of a response when the buffer ID field BUFFER ID is 01 and a response when the buffer ID field BUFFER ID is 02 are utilized, the host device 100 may set the buffer ID field BUFFER ID of the READ BUFFER COMMAND to 03 and transmit the READ BUFFER COMMAND to the memory device 200.

The memory device 200 that has received the READ BUFFER COMMAND may include the parameters utilized for performing the EOM operation, such as the phase selection field PHASE SELECT, the reference voltage control field VREF CONTROL, and the number-of-sampling field NUMBER OF SAMPLING and the receive parameters set in the PHY register of the memory device 200 in the response signal, as illustrated in FIG. 25, and transmit the response signal to the host device 100, as a response to the reception of the READ BUFFER COMMAND.

In addition, in this case, the memory device 200 may include the error count value ERR_CNT of the EOM operation performed in the memory device 200 in the response signal and transmit the response signal to the host device 100.

The memory device 200 may transmit the response signal to the host device 100 based on a data capacity that may be transmitted between the memory device 200 and the host device 100 at a certain time. For example, when the data capacity that may be transmitted between the memory device 200 and the host device 100 at a certain time is 12 bytes, the memory device 200 may transmit the phase selection field PHASE SELECT, the reference voltage control field VREF CONTROL, and the number-of-sampling field NUMBER OF SAMPLING stored in the memory device 200, the receive parameters set in the PHY register of the memory device 200, and the error count value ERR_CNT of the EOM operation performed in the memory device 200 to the host device 100, in units of 12 bytes.

As described above, in an embodiment, various parameters applied to the EOM operation performed in the memory device 200 and the receive parameters set in the receive end of the memory device 200 may be easily identified using the READ BUFFER COMMAND, such that the EOM may be efficiently and reliably performed.

Figure 26:
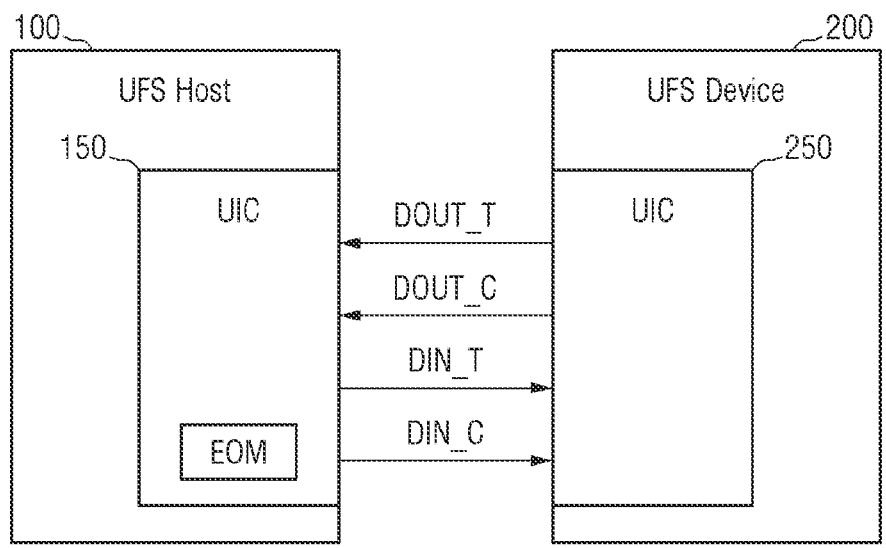
FIG. 26 is a diagram illustrating a memory system according to embodiments.

FIG. 26 is a diagram illustrating a memory system according to embodiments. Hereinafter, for convenience of explanation, a further description of elements and technical aspects previously described may be omitted, and the description will focus primarily on differences from embodiments described above.

Referring to FIG. 26, in an embodiment, the UIC layer 150 of the host device 100 performs the EOM operation described above. For example, the UIC layer 150 of the host device 100 may perform the EOM operation on a pair of differential output signals DOUT_T and DOUT_C received from the memory device 200.

For example, while embodiments in which the host device 100 transmits data and the memory device 200 receives the data have been described above, in an embodiment according to FIG. 26, the memory device 200 transmits data and the host device 100 receives the data. In this case, the above description for the transmit end may be applied to the memory device 200, and the above description for the receive end may be applied to the host device 100. That is, the role of the host device 100 described above may be exchanged with the role of the memory device 200 described above.

Figure 27:
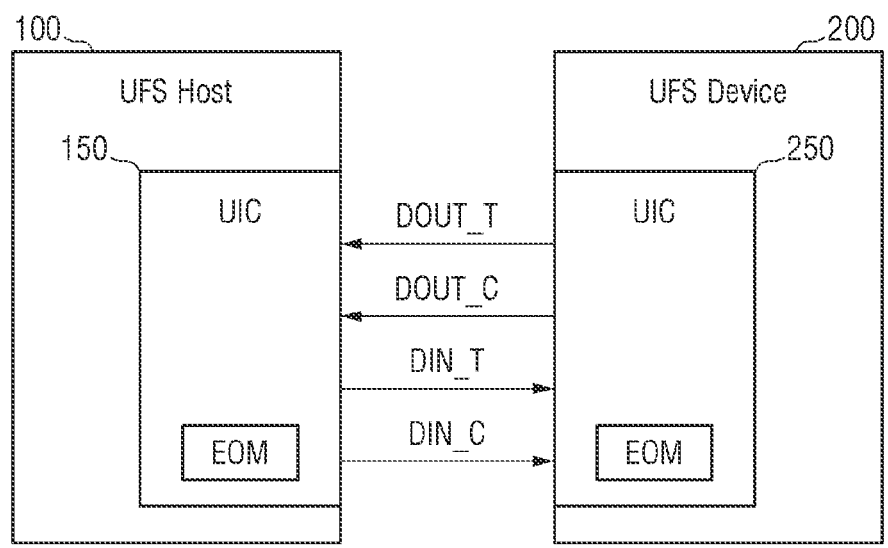
FIG. 27 is a diagram illustrating a memory system according to embodiments.

FIG. 27 is a diagram illustrating a memory system according to embodiments. Hereinafter, for convenience of explanation, a further description of elements and technical aspects previously described may be omitted, and the description will focus primarily on differences from embodiments described above.

Referring to FIG. 27, in an embodiment, both of the UIC layer 150 of the host device 100 and the UIC layer 250 of the memory device 200 perform the EOM operation described above.

In this case, the above description for the transmit end may be applied to both the host device 100 and the memory device 200, and the above description for the receive end may also be applied to both the host device 100 and the memory device 200.

As is traditional in the field of the present disclosure, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

While the present disclosure has been particularly shown and described with reference to embodiments thereof, it will be understood by those of ordinary skill in the art that various changes in form and detail may be made therein without departing from the spirit and scope of the present disclosure as defined by the following claims.

What is claimed is:

1. A method of identifying information related to an eye open monitor (EOM) operation performed in a memory device, comprising:
transmitting, from a host device to the memory device, a read command that requests both (i) user data from the memory device and (ii) the information related to the EOM operation performed in the memory device; and
receiving, at the host device, a response signal including the information related to the EOM operation performed in the memory device from the memory device in response to the memory device receiving the read command.

2. The method of claim 1, wherein the read command includes a READ BUFFER COMMAND.

3. The method of claim 2, wherein a mode field of the READ BUFFER COMMAND is set to 1F.

4. The method of claim 1, wherein the read command includes an indication field indicating information to be included in the response signal among the information related to the EOM operation performed in the memory device.

5. The method of claim 4, wherein the read command includes a READ BUFFER COMMAND, and
the indication field includes a buffer ID field.

6. The method of claim 4, wherein the read command includes an offset value, and
the response signal includes an error count value corresponding to the offset value.

7. The method of claim 4, wherein the response signal includes an offset value of the EOM operation performed in the memory device.

8. The method of claim 4, wherein the response signal includes a receive parameter of a receive end of the memory device.

9. The method of claim 4, wherein the response signal includes an offset value of the EOM operation performed in the memory device and a receive parameter of a receive end of the memory device.

10. A method of identifying information related to an eye open monitor (EOM) operation performed in a memory device, comprising:
receiving, at the memory device, a read command that requests both (i) user data from the memory device and (ii) the information related to the EOM operation performed in the memory device, from a host device;
identifying an indication field of the read command; and
transmitting, from the memory device to the host device, a response signal including information corresponding to a value of the indication field among the information related to the EOM operation in response to the memory device receiving the read command.

11. The method of claim 10, wherein the read command includes a READ BUFFER COMMAND.

12. The method of claim 11, wherein a mode field of the READ BUFFER COMMAND is set to 1F.

13. The method of claim 10, wherein the read command includes a READ BUFFER COMMAND, and
the indication field includes a buffer ID field.

14. The method of claim 13, wherein in response to the indication field having a certain value, the response signal includes an error count value corresponding to an offset value included in the read command.

15. The method of claim 13, wherein in response to the indication field having a certain value, the response signal includes an offset value of the EOM operation performed in the memory device and an error count value of the EOM operation performed in the memory device.

16. The method of claim 13, wherein in response to the indication field having a certain value, the response signal includes a receive parameter of a receive end of the memory device and an error count value of the EOM operation performed in the memory device.

17. The method of claim 13, wherein in response to the indication field having a certain value, the response signal includes an offset value of the EOM operation performed in the memory device, a receive parameter of a receive end of the memory device, and an error count value of the EOM operation performed in the memory device.

18. A memory system, comprising:
a host device comprising a host controller; and
a memory device comprising a device controller,
wherein the host controller transmits a read command that requests both (i) user data from the memory device and (ii) information related to an eye open monitor (EOM) operation performed in the memory device to the memory device, the read command includes an indication field indicating information to be included in a response signal among the information related to the EOM operation performed in the memory device, and the device controller transmits the response signal including information corresponding to a value of the indication field among the information related to the EOM operation to the host device in response to the memory device receiving the read command.

19. The memory system of claim 18, wherein the read command includes a READ BUFFER COMMAND, and the indication field includes a buffer ID field of the READ BUFFER COMMAND.

20. The memory system of claim 19, wherein the device controller transmits at least one of an offset value of the EOM operation performed in the memory device and a receive parameter of a receive end of the memory device to the host device, according to the buffer ID field.

\* \* \* \* \*